(12) United States Patent
Takarada et al.

(10) Patent No.: US 11,347,153 B2
(45) Date of Patent: May 31, 2022

(54) ERROR DETECTION AND CORRECTION IN LITHOGRAPHY PROCESSING

(71) Applicant: CANON KABUSHIKI KAISHA, Tokyo (JP)

(72) Inventors: Yosuke Takarada, Utsunomiya (JP); Yusuke Miura, Nikko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 221 days.

(21) Appl. No.: 16/436,658

(22) Filed: Jun. 10, 2019

(65) Prior Publication Data
US 2019/0384182 A1    Dec. 19, 2019

(30) Foreign Application Priority Data

Jun. 14, 2018    (JP) .............................. JP2018-113942

(51) Int. Cl.
| | | |
|---|---|---|
| *G05B 19/41* | (2006.01) | |
| *H01L 21/02* | (2006.01) | |
| *G03F 7/20* | (2006.01) | |
| *G05B 19/418* | (2006.01) | |

(52) U.S. Cl.
CPC ..... *G03F 7/7065* (2013.01); *G05B 19/41875* (2013.01); *G03F 7/70* (2013.01); *G05B 2219/45028* (2013.01); *G05B 2219/45031* (2013.01); *H01L 21/02* (2013.01)

(58) Field of Classification Search
None
See application file for complete search history.

(56) References Cited

U.S. PATENT DOCUMENTS

| | | | | |
|---|---|---|---|---|
| 2004/0114132 A1* | 6/2004 | Den Boef | ............... | G03F 7/706 |
| | | | | 356/124 |
| 2004/0158344 A1* | 8/2004 | Inobe | ................. | G05B 19/4183 |
| | | | | 700/121 |
| 2005/0273753 A1* | 12/2005 | Sezginer | ............. | G03F 7/70425 |
| | | | | 716/52 |
| 2006/0273266 A1* | 12/2006 | Preil | ..................... | G03F 7/7065 |
| | | | | 250/548 |
| 2008/0006777 A1* | 1/2008 | Inoue | ..................... | B82Y 40/00 |
| | | | | 250/398 |
| 2008/0294280 A1 | 11/2008 | Okita | | |

(Continued)

FOREIGN PATENT DOCUMENTS

| | | |
|---|---|---|
| CN | 1969370 A | 5/2007 |
| CN | 103026299 A | 4/2013 |

(Continued)

*Primary Examiner* — Mohammad Ali
*Assistant Examiner* — Kelvin Booker
(74) *Attorney, Agent, or Firm* — Canon U.S.A., Inc. IP Division

(57) ABSTRACT

An information processing apparatus includes an acquisition unit configured to acquire a plurality of pieces of collected data collected in a state where lithographic processing is executed by a lithography apparatus for forming a pattern by applying a plurality of processing conditions, a classification unit configured to classify the acquired data based on the processing conditions, a judgement unit configured to judge that an abnormality has occurred in the acquired collected data by judging whether the collected data falls within an allowable range specified based on the processing conditions.

24 Claims, 18 Drawing Sheets

(56) References Cited

U.S. PATENT DOCUMENTS

| | | | | |
|---|---|---|---|---|
| 2010/0112468 A1* | 5/2010 | Poock | ................ | G03F 7/707 |
| | | | | 430/30 |
| 2011/0096311 A1* | 4/2011 | Butler | ................ | G03F 7/70358 |
| | | | | 355/53 |
| 2013/0182236 A1* | 7/2013 | De Schiffart | ......... | G03F 7/0002 |
| | | | | 355/74 |
| 2014/0125963 A1* | 5/2014 | Watanabe | ........... | G03F 7/70483 |
| | | | | 355/77 |
| 2015/0286001 A1* | 10/2015 | Konno | ................ | G03F 7/7065 |
| | | | | 348/95 |
| 2016/0150191 A1* | 5/2016 | Karsenti | ............ | G06F 16/9535 |
| | | | | 382/149 |

FOREIGN PATENT DOCUMENTS

| | | | | | |
|---|---|---|---|---|---|
| CN | 104272184 | A | | 1/2015 | |
| CN | 107379455 | A | | 11/2017 | |
| DE | 10-2017-004439 | A1 | | 11/2017 | |
| EP | 1753017 | A1 | | 2/2007 | |
| EP | 1818972 | A1 | | 8/2007 | |
| JP | H09-304913 | A | * | 11/1997 | ............... G03F 1/68 |
| JP | 2001-136727 | A | | 5/2001 | |
| JP | 2003197509 | A | * | 7/2003 | ............... G03F 7/20 |
| JP | 2007-57948 | A | * | 3/2007 | ............... G03F 1/70 |
| JP | 2007-189179 | A | | 7/2007 | |
| JP | 2008166734 | A | * | 7/2008 | ........... H01L 21/027 |
| JP | 4158384 | B2 | * | 10/2008 | ............. H01L 21/02 |
| JP | 2010-087459 | A | | 4/2010 | |
| JP | 2011-54804 | A | | 3/2011 | |
| JP | 4744980 | B2 | * | 8/2011 | ............... G03F 1/68 |
| JP | 4787673 | B2 | * | 10/2011 | ............. H01L 21/66 |
| KR | 10-0588112 | B1 | * | 6/2006 | ............... G03F 7/20 |

\* cited by examiner

FIG.11

| ABNORMALITY | MAINTENANCE METHOD |
|---|---|
| ABNORMALITY IN SYNCHRONIZATION ACCURACY | FILTER ADJUSTMENT |
| | CONTROL PARAMETER ADJUSTMENT |
| ABNORMALITY IN ILLUMINANCE | SLIT ADJUSTMENT |
| | OPTICAL AXIS ADJUSTMENT |
| ABNORMALITY IN ALIGNMENT MEASUREMENT | SAMPLE SHOT SEARCH |
| | ALIGNMENT ILLUMINATION SYSTEM OPTIMIZATION |
| | TEMPLATE UPDATE |

FIG.13

| ABNORMALITY TYPE | DATE/TIME | EXPOSURE APPARATUS | PROCESSING CONDITION | MAINTENANCE METHOD | RESULT |
|---|---|---|---|---|---|
| ABNORMALITY IN SYNCHRONIZATION ACCURACY | YYYY/MM/DD HH:MM | EXPOSURE APPARATUS 1 | PROCESSING CONDITION 1 | FILTER ADJUSTMENT | SUCCESS |
| ABNORMALITY IN ALIGNMENT MEASUREMENT | YYYY/MM/DD HH:MM | EXPOSURE APPARATUS 3 | PROCESSING CONDITION 1 | ALIGNMENT ILLUMINATION SYSTEM OPTIMIZATION | SUCCESS |
| ABNORMALITY IN ILLUMINANCE | YYYY/MM/DD HH:MM | EXPOSURE APPARATUS 2 | PROCESSING CONDITION 2 | OPTICAL AXIS ADJUSTMENT | FAILURE |
| ABNORMALITY IN ILLUMINANCE | YYYY/MM/DD HH:MM | EXPOSURE APPARATUS 2 | PROCESSING CONDITION 2 | SLIT ADJUSTMENT | SUCCESS |
| ABNORMALITY IN SYNCHRONIZATION ACCURACY | YYYY/MM/DD HH:MM | EXPOSURE APPARATUS 1 | PROCESSING CONDITION 2 | CONTROL PARAMETER ADJUSTMENT | SUCCESS |
| ABNORMALITY IN ALIGNMENT MEASUREMENT | YYYY/MM/DD HH:MM | EXPOSURE APPARATUS 1 | PROCESSING CONDITION 1 | TEMPLATE UPDATE | SUCCESS |
| ABNORMALITY IN SYNCHRONIZATION ACCURACY | YYYY/MM/DD HH:MM | EXPOSURE APPARATUS 3 | PROCESSING CONDITION 2 | FILTER ADJUSTMENT | SUCCESS |
| ABNORMALITY IN ILLUMINANCE | YYYY/MM/DD HH:MM | EXPOSURE APPARATUS 2 | PROCESSING CONDITION 1 | OPTICAL AXIS ADJUSTMENT | SUCCESS |
| ABNORMALITY IN SYNCHRONIZATION ACCURACY | YYYY/MM/DD HH:MM | EXPOSURE APPARATUS 1 | PROCESSING CONDITION 1 | | |

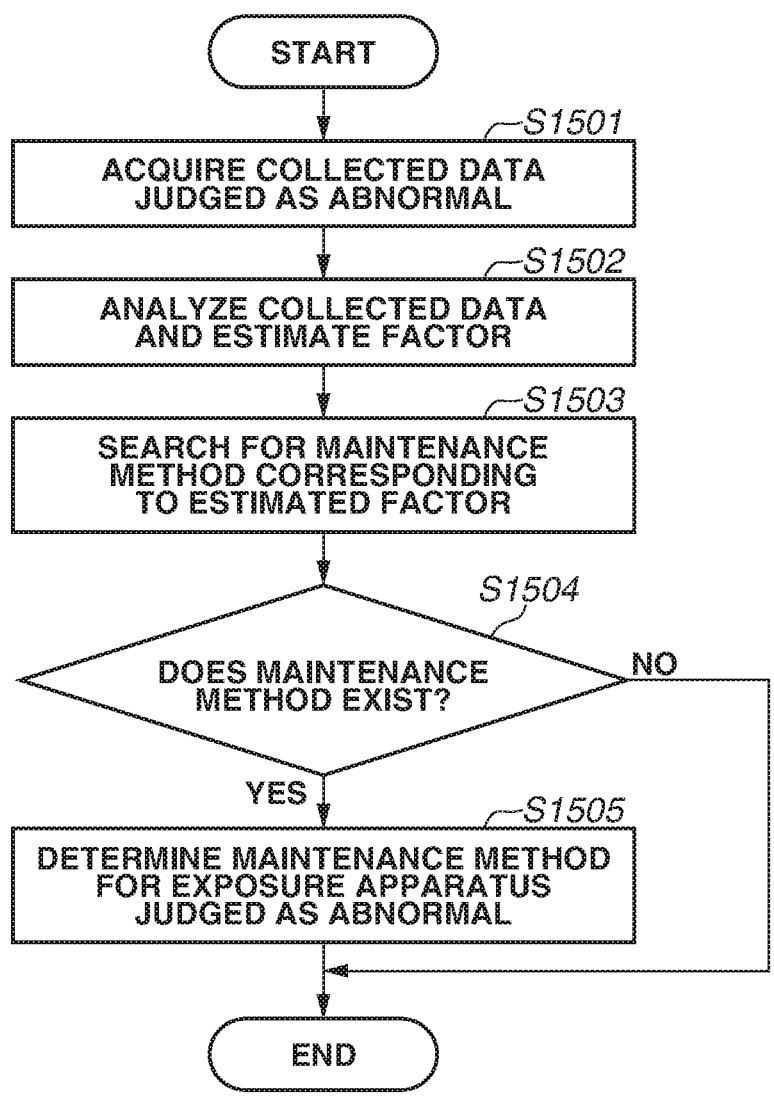

FIG.17

| FACTOR OF ABNORMALITY | MAINTENANCE METHOD |
|---|---|
| ABNORMALITY IN INITIAL POSITION | CONTROL PARAMETER ADJUSTMENT |
| GENERATION OF VIBRATION | FILTER ADJUSTMENT |
| ADHESION OF FOREIGN PARTICLES | CHUCK CLEANING |

ERROR DETECTION AND CORRECTION IN LITHOGRAPHY PROCESSING

BACKGROUND OF THE INVENTION

Field of the Invention

The present invention relates to an information processing apparatus, a judgement method, a program, a lithography system, and a manufacturing method of an article.

Description of the Related Art

In the manufacture of an article such as a semiconductor device, micro-electro mechanical systems (MEMS), or a flat-panel display, because of progress in miniaturization of a pattern to be formed on a substrate, there is an increased demand for improvement in performance of a lithography apparatus, i.e., resolution, overlay accuracy, and productivity.

In order to fulfill the demand for improvement in the performance of the lithography apparatus, it is necessary to solve the abnormality that may cause lowering of the performance of the lithography apparatus.

Japanese Patent Application Laid-Open No. 2011-54804 discusses a management method of a semiconductor manufacturing apparatus which makes it possible to automatically solve the abnormality in the semiconductor manufacturing apparatus without requiring manual operation of an engineer. In this method, a semiconductor manufacturing apparatus causes defect in a semiconductor integrated circuit is specified from among a plurality of semiconductor manufacturing apparatuses, and the semiconductor manufacturing apparatus is judged whether an internal state thereof is in a normal state. Then, if the internal state is not a normal state, processing for controlling an input to return the internal state thereof to a normal state is executed.

In the method described in Japanese Patent Application Laid-Open No. 2011-54804, by employing the principal component analysis, a principal component vector is calculated from the equipment engineering system (EES) data as an apparatus parameter which describes an internal state of the semiconductor manufacturing apparatus. Then, in a principal component space to which the principal component vector belongs, processing for judging whether the principal component vector belongs to an area representing a normal state is executed. However, there is a case where the area representing the normal state becomes different depending on a processing condition applied to the semiconductor manufacturing apparatus. In other words, a range of the area representing a normal state, which is used for judging whether the internal state is in a normal state, may be changed depending on the processing condition applied to the semiconductor manufacturing apparatus when the EES data is acquired. Therefore, if the area representing a normal state is not determined with consideration of the processing condition, it will be difficult to precisely judge whether the internal state of the semiconductor manufacturing apparatus is in a normal state.

SUMMARY OF THE INVENTION

The present invention is directed to an information processing apparatus capable of precisely judging an abnormality occurring in a lithography apparatus, a judgement method, a program, a lithography system, and a manufacturing method of an article.

According to an aspect of the present invention, an information processing apparatus includes an acquisition unit configured to acquire a plurality of pieces of collected data collected in a state where lithographic processing is executed by a lithography apparatus for forming a pattern by applying a plurality of processing conditions, a classification unit configured to classify the acquired data based on the processing conditions, a judgement unit configured to judge that an abnormality has occurred in the acquired collected data by judging whether the collected data falls within an allowable range specified based on the processing conditions.

Further features of the present invention will become apparent from the following description of exemplary embodiments with reference to the attached drawings.

BRIEF DESCRIPTION OF THE DRAWINGS

FIG. 11 is a table illustrating an example of a relationship between a detected abnormality and a maintenance method.

FIG. 13 is a table illustrating history information.

FIG. 15 is a flowchart illustrating a method of determining a maintenance method by employing factor analysis.

FIG. 17 is a table illustrating a relationship between a factor of an abnormality and a maintenance method.

DESCRIPTION OF THE EMBODIMENTS

Exemplary embodiments of the present invention will be described below in detail with reference to the appended drawings. In each of the drawings, the same reference number is applied to the same member, and duplicate description will be omitted.

Figure 1:
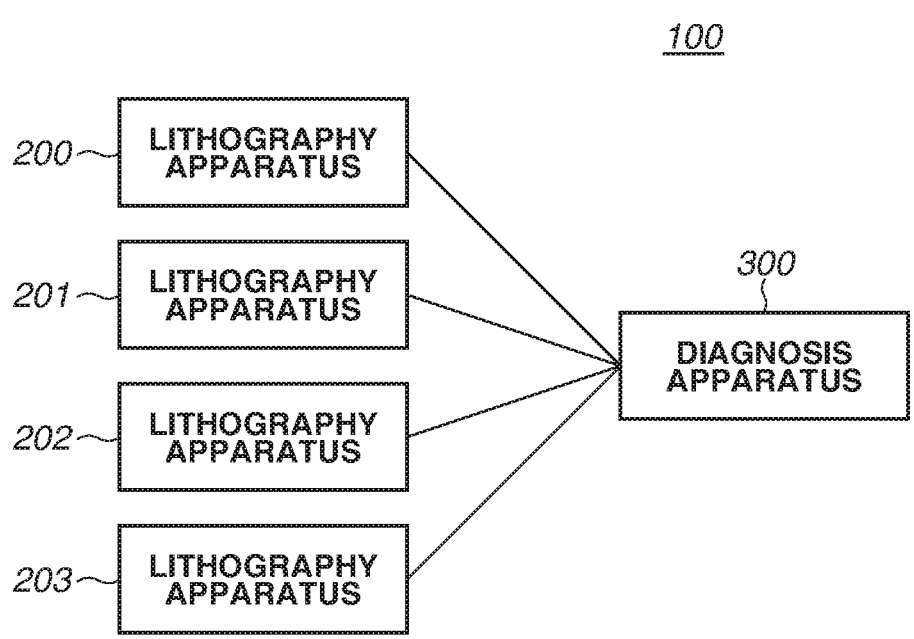
FIG. 1 is a block diagram illustrating a lithography system.

In a first exemplary embodiment, a lithography system including a plurality of lithography apparatuses and a diagnosis apparatus will be described. FIG. 1 is a block diagram illustrating a lithography system. A lithography system 100 according to the present exemplary embodiment includes lithography apparatuses 200 to 203 each of which forms a pattern on a wafer (substrate) and a diagnosis apparatus 300 that judges an abnormality in a lithography apparatus to determine a maintenance method for executing maintenance of the lithography apparatus. The maintenance method for executing maintenance of the lithography apparatus is a method executed for solving an abnormality in the lithography apparatus. For example, in a case where an abnormality caused by an error regarding the position of the below-described wafer stage is judged, a maintenance method for reducing the vibration of the wafer stage may be executed in order to maintain the lithography apparatus. Further, the lithography apparatus may include an exposure apparatus which irradiates a reticle (i.e., a mask or an original plate) on which a pattern is formed with light, and projects the pattern on a shot area of a wafer by the light from the reticle. Further, for example, the lithography apparatus may include an imprint apparatus that brings an imprint material supplied on a wafer into contact with a mold (i.e., an original plate), and forms a composition on which a shape of the mold is transferred by applying curing energy to the imprint material. Furthermore, the lithography apparatus may include a drawing apparatus that draws a pattern on a substrate with a charged-particle beam (e.g., an electron beam or an ion beam) via a charged-particle optical system to form a pattern on the substrate. Further, for example, the lithography apparatus also may include a manufacturing apparatus such as an application apparatus for applying a photosensitive medium on a substrate or a development apparatus for developing a transferred pattern on a substrate, which executes processing other than the processing executed by the above-described apparatus such as the exposure apparatus in the manufacture of an article such as a device. Further, in FIG. 1, although the lithography apparatuses 200 to 203 are arranged, the number of lithography apparatuses is not limited to 4.

Figure 2:
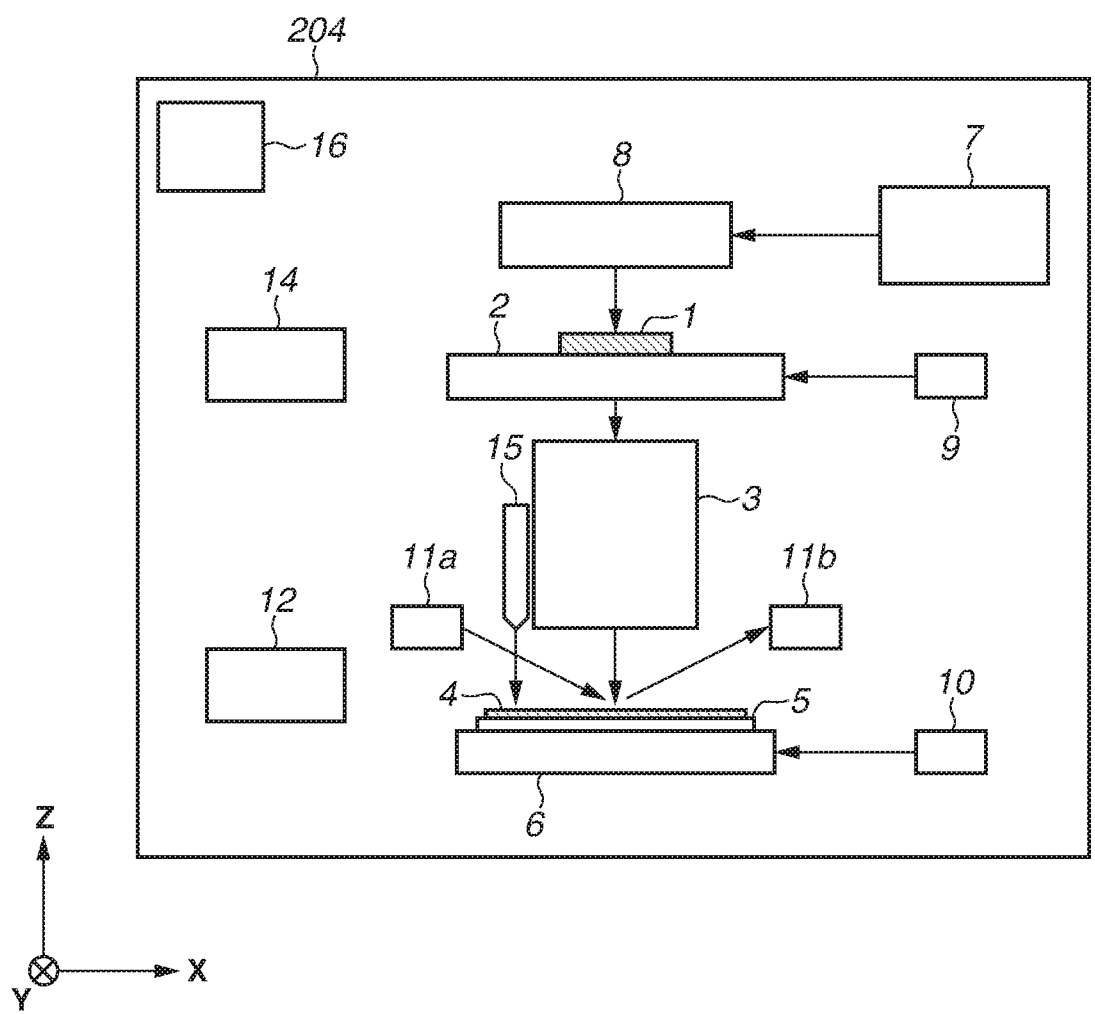
FIG. 2 is a schematic diagram illustrating an exposure apparatus.

Next, an exposure apparatus will be described as an example of the lithography apparatuses 200 to 203. The exposure apparatus exposes a wafer to light radiated from a reticle on which a pattern is formed. FIG. 2 is a schematic diagram illustrating an exposure apparatus as an example of the lithography apparatus. An exposure apparatus 204 according to the present exemplary embodiment will be described as a step-and-scan type exposure apparatus (scanner) that executes exposure processing while synchronously driving a reticle stage and a wafer stage. However, the exposure apparatus 204 is not limited to a scanner, but may be a step-and-repeat type exposure apparatus (stepper) that executes exposure processing on a wafer while a wafer stage is in a stationary state. In the example in FIG. 2, the exposure apparatus 204 includes a light source 7, an illumination optical system 8, a reticle stage 2, a projection optical system 3, a wafer stage 6, a wafer chuck 5, and a control unit 16. The exposure apparatus 204 further includes laser interferometers 9 and 10, a focus sensor 11, a wafer conveyance unit 12, a reticle conveyance unit 14, and an alignment scope 15. In addition, in FIG. 2, a direction parallel to the optical axis of the projection optical system 3 is defined as a Z-axis direction, and two directions orthogonal to each other in a plane perpendicular to the Z-axis direction are defined as an X-axis direction and a Y-axis direction respectively.

For example, a high-pressure mercury lamp, an argon-fluoride (ArF) excimer laser device, or a krypton-fluoride (KrF) excimer laser device may be used as the light source 7. Further, the light source 7 does not always have to be arranged inside a chamber of the exposure apparatus 204, but may be arranged externally. Light emitted from the light source 7 illuminates a reticle 1 (i.e., an original plate or a mask) (not illustrated) via the illumination optical system 8. A pattern that to be transferred onto the wafer 4 (i.e., substrate) on which a photosensitive material is applied is drawn on a reticle 1, and the reticle 1 is mounted on the reticle stage 2. The reticle stage 2 suctions and holds the reticle 1 via a reticle chuck (not illustrated). For example, the reticle stage 2 is configured to be movable by a linear motor (not illustrated).

The projection optical system 3 projects an image of the pattern drawn on the reticle 1 onto the wafer 4 placed on the wafer chuck 5 (i.e., exposure processing). When the image of the pattern is projected on the wafer 4, the image that is inverted and reduced by a projection magnification (e.g., ¼ magnifications) is projected on the wafer 4 via the projection optical system 3. An area where the image of the pattern is projected is called as a shot area. A plurality of shot areas is set on the wafer 4, and projection is sequentially and repeatedly executed on the shot areas.

The wafer stage 6 is driven by a linear motor (not illustrated) and moved in the X-direction and the Y-direction. The wafer chuck 5 is mounted on the wafer stage 6 to hold the wafer 4. The wafer stage 6 fixes a position of the wafer chuck 5 in the Z-direction, the 0-direction, the ωX-direction, and the ωY-direction, where 0 is an angle of the wafer on the X-Y plane, ωX is the angle of the wafer on the Y-Z plane, and ωY is the angle of the wafer on the X-Z plane. As described above, the wafer 4 held by the wafer chuck 5 is moved by a driving the wafer stage 6 and the wafer chuck 5.

The laser interferometer 9 measures a position of the reticle stage 2 in the Y-direction and the orientation of the reticle stage 2. The laser interferometer 9 includes a laser interferometer (not illustrated) for measuring a position in the X-direction of the reticle stage 2 in a similar manner. Further, the laser interferometer 10 measures a position of the wafer stage 6 in the Y-direction, on which the wafer 4 is mounted, and the orientation of the wafer stage 6. Further, the laser interferometer 10 includes a laser interferometer (not illustrated) for measuring a position of the wafer stage 6 in the X-direction in a similar manner. Based on the positions measured by the laser interferometers 9 and 10, positions of the reticle stage 2 and the wafer stage 6 are controlled by a control unit 16 described below.

The focus sensor 11 includes a light projection system 11a for projecting light (a plurality of beams) onto the wafer 4, a light receiving system 11b for receiving light reflected on the wafer 4, and a detection unit (not illustrated) for detecting light from the light receiving system 11b and outputting a detection signal to the control unit 16. The light projection system 11a and the light receiving system 11b are arranged so as to interpose a vicinity of a light emitting portion of the projection optical system 3 therebetween. The light projection system 11a obliquely emits light to the wafer 4, and the light receiving system 11b takes in the reflected light on the opposite side thereof. Based on the detection signal detected by the focus sensor 11, the below-described control unit 16 measures a position of the wafer 4 in the Z-direction and controls the movement of the wafer 4 moved by the wafer stage 6.

The wafer conveyance unit 12 conveys the wafer 4. The wafer conveyance unit 12 conveys the wafer 4 to the wafer stage 6 from a wafer storage container (not illustrated) for storing the wafer 4. Further, the wafer conveyance unit 12 conveys the wafer 4 to the wafer storage container from the wafer stage 6.

The reticle conveyance unit 14 conveys the reticle 1. The reticle conveyance unit 14 conveys the reticle 1 to the reticle stage 2 from a reticle storage container (not illustrated) for storing the reticle 1. Further, the reticle conveyance unit 14 conveys the reticle 1 to the reticle storage container from the reticle stage 2.

The alignment scope 15 captures an image of a mark formed on the wafer 4 to acquire a digital image signal in order to execute positioning (alignment) of the wafer 4 held by the wafer chuck 5. The alignment scope 15 includes an image sensor (not illustrated) for outputting a contrast image signal corresponding to brightness (contrast) of reflection light from the wafer 4 (i.e., contrast), and an analog-to-digital (A/D) conversion unit (not illustrated) for converting the contrast image signal acquired from the image sensor into a digital image signal. The below-described control unit 16 detects the position of the mark formed on the wafer 4 by using the acquired digital image signal and executes positioning of the wafer 4 by controlling the wafer stage 6 based on the position of the detected mark.

The control unit 16 controls the processing for exposing the wafer 4 to light by executing operation control and adjustment control of respective units of the exposure apparatus 204. The control unit 16 is an information processing apparatus configured of a combination of all or a part of a programmable logic device (PLD) such as a field programmable gate array (FPGA), an application specific integrated circuit (ASIC), and a computer on which a program is built-in. Further, the control unit 16 may be configured of a plurality of information processing apparatuses. Further, the control unit 16 may be arranged integrally with another part of the exposure apparatus 204 in a common housing, or may be arranged separately from another part of the exposure apparatus 204 in a separate housing. Further, the control unit 16 executes control to execute the exposure processing (lithographic processing) of the wafer 4 by applying the below-described processing condition acquired from the storage device. For example, a processing condition applied to the exposure processing may include a conveyance condition that specifies a speed or a path for conveying the wafer 4 to the wafer stage 6 by the wafer conveyance unit 12. Further, for example, a processing condition applied to the exposure processing may include a positioning condition that specifies an error allowable when the wafer 4 is positioned by the wafer stage 6. Furthermore, for example, a processing condition applied to the exposure processing may include a measurement condition that specifies an irradiation period and an irradiation timing of light when measurement is executed by the focus sensor 11. Further, for example, a processing condition applied to the exposure processing may include an exposure condition that specifies an identifier of the reticle 1, a layout of a shot area on the wafer 4, and an illumination mode when the wafer 4 is exposed to light. Further, for example, a processing condition applied to the exposure processing may include a setup condition including information such as an environmental condition for specifying a temperature and an atmospheric pressure inside the exposure apparatus 204, a model of the exposure apparatus 204, and a version of software.

Figure 3:
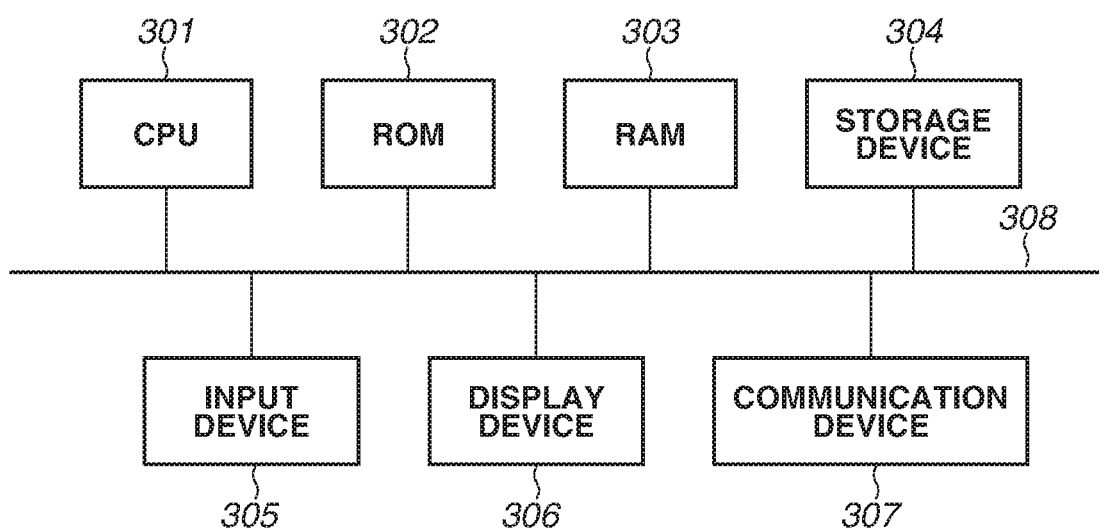
FIG. 3 is a block diagram illustrating a hardware configuration of an information processing apparatus.

FIG. 3 is a block diagram illustrating a hardware configuration of an information processing apparatus. Each of the hardware constituent elements of the information processing apparatus functions based on a program. In the example in FIG. 3, a central processing unit (CPU) 301 is a processing device for executing calculation for executing control based on a program and controlling the respective constituent elements connected to a bus 308. A read only memory (ROM) 302 is a memory dedicated for reading out data, and a program and data are stored therein. A random access memory (RAM) 303 is a memory for reading and writing data, and is used for storing a program and data. The RAM 303 is used for temporarily storing data such as a calculation result acquired by the CPU 301. A storage device 304 is also used for storing a program and data. The storage device 304 is also used as an area for temporarily storing a program of an operating system (OS) for the information processing apparatus and data. Although data input/output speed of the storage device 304 is slower than that of the RAM 303, a large volume of data can be stored in the storage device 304. It is desirable that the storage device 304 is a non-volatile storage device capable of storing data as persistent data, so that the stored data can be referred to for a long period of time. Although the storage device 304 is mainly configured of a magnetic storage device such as a hard disk drive (HDD), the storage device 304 may be a device that reads and writes data, on which an external media such as a compact disc (CD), a digital versatile disc (DVD), or a memory card is mounted. An input device 305 is a device for inputting text and data to the information processing apparatus, and a keyboard or a mouse corresponds thereto. A display device 306 is a device for displaying information or a processing result required for operating the information processing apparatus, and a cathode-ray tube monitor or a liquid crystal monitor corresponds thereto. A communication device 307 is used when the information processing apparatus connects to a network to execute data communication using a communication protocol such as a transmission control protocol/internet protocol (TCP/IP), and mutually communicates with another information processing apparatus. Further, the information processing apparatus may include a graphics processor unit (GPU) (not illustrated), so that calculation processing can be executed at high speed.

Figure 4:
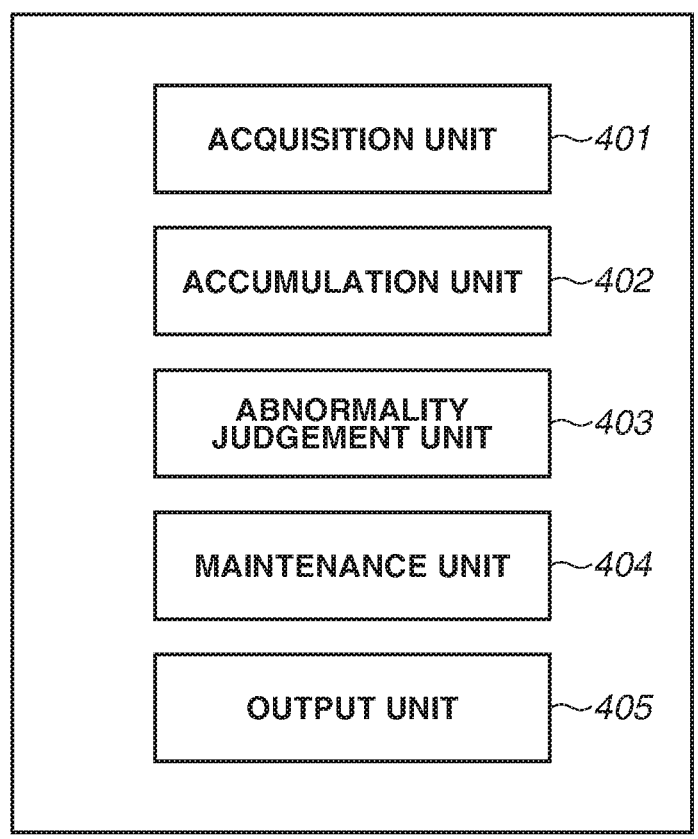
FIG. 4 is a block diagram illustrating a configuration of a central processing unit (CPU) of a diagnosis apparatus.

Next, a diagnosis apparatus 300 will be described. The diagnosis apparatus 300 is an information processing apparatus including, for example, a configuration as illustrated in the example in FIG. 3. The diagnosis apparatus 300 connects to a plurality of exposure apparatuses 204 via the communication device 307 to execute data communication. FIG. 4 is a block diagram illustrating a configuration of a CPU of the diagnosis apparatus 300. The CPU of the diagnosis apparatus 300 includes an acquisition unit 401, an accumulation unit 402, an abnormality judgement unit 403, a maintenance unit 404, and an output unit 405.

Figure 5:
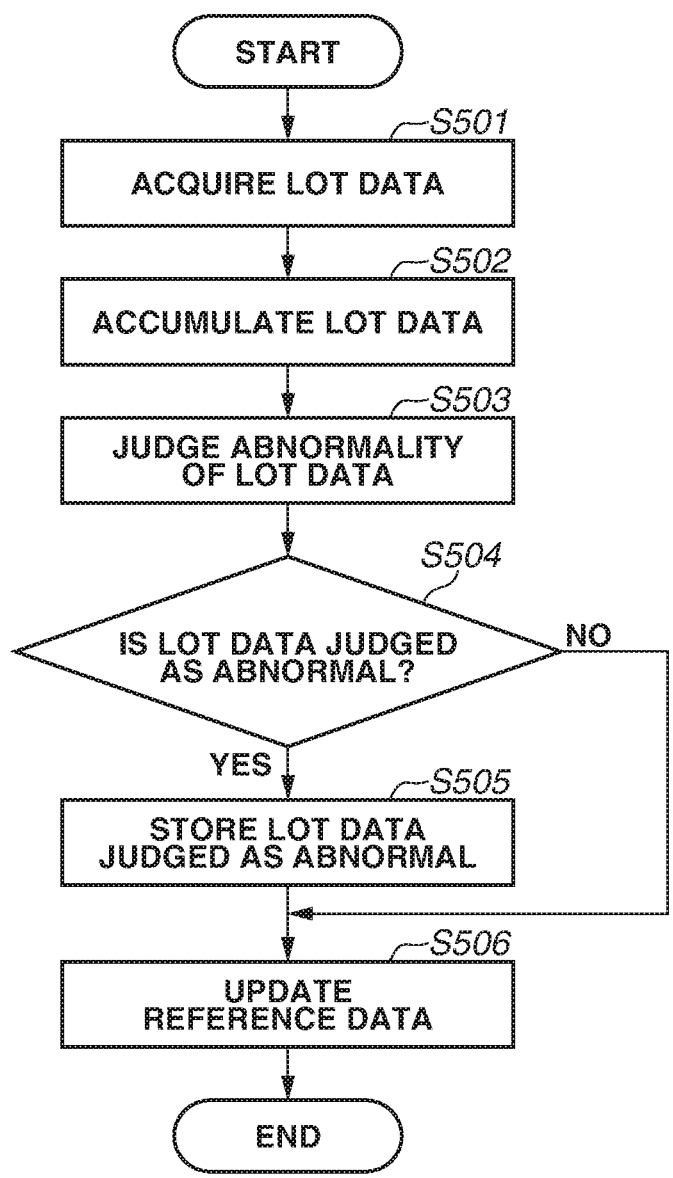
FIG. 5 is a flowchart illustrating a method of determining an abnormality in an exposure apparatus.

Next, a method for judging an abnormality in the exposure apparatus 204 by the diagnosis apparatus 300 will be described. FIG. 5 is a flowchart illustrating a method for judging an abnormality in the exposure apparatus 204. First, in step S501, the acquisition unit 401 acquires lot data from the exposure apparatus 204. Further, the acquisition unit 401 acquires information for specifying the exposure apparatus 204 (e.g., an identification (ID) indicating the exposure apparatus 204) and information for specifying a processing condition applied when the lot data has been acquired (e.g., an ID indicating a processing condition) together with the lot data.

Figure 6:
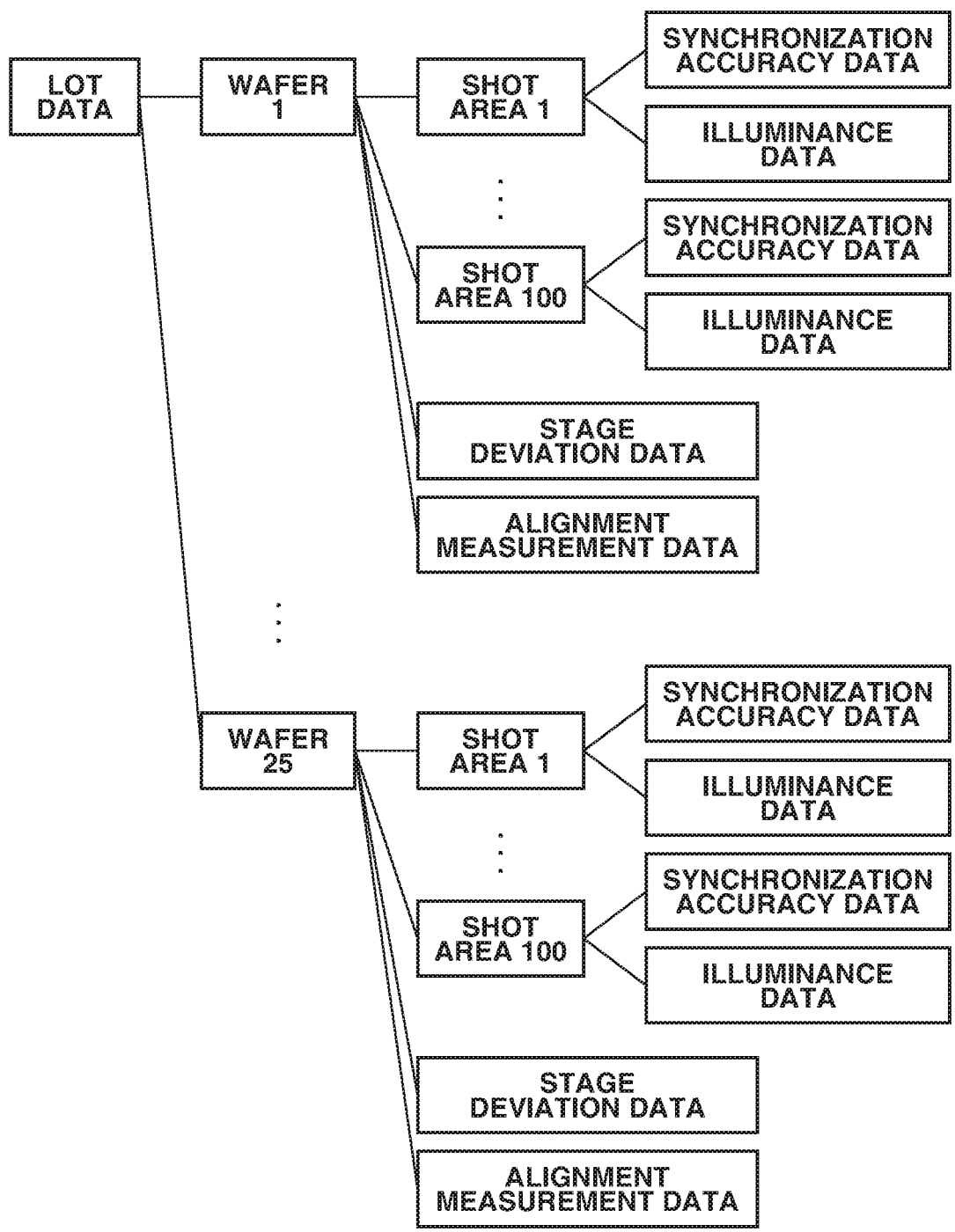
FIG. 6 is a block diagram illustrating lot data.

Here, the lot data will be described. FIG. 6 is a diagram illustrating an example of the lot data. When the exposure apparatus 204 executes exposure processing of the wafer 4, the exposure processing is executed in a unit of "lot" that includes a plurality of wafers 4 (e.g., 25 wafers 4). Further, the same processing condition is applied when the exposure processing is executed on the plurality of wafers 4 belonging to the same lot. Further, a layout of a plurality of shot areas (e.g., one hundred shot areas) is previously determined as exposure areas on the wafer 4, and the exposure apparatus 204 repeatedly executes exposure processing on the plurality of shot areas on the wafer 4. In the example in FIG. 6, one lot includes 25 wafers 4, and one hundred shot areas are set with respect to each of the wafers 4. However, the number of wafers 4 or the shot areas are not limited thereto.

The lot data is a collection of data collected when exposure processing is executed by applying the same processing condition to the plurality of wafers 4 belonging to the one lot described above. The lot data has a hierarchical structure, and pieces of collected data collected when exposure processing is executed on the plurality of shot areas of the wafer 4 are classified and stored for each wafer 4 or each shot area. Further, in the example in FIG. 6, synchronization accuracy data and illuminance data are classified and stored for each shot area, and stage deviation data and alignment measurement data are classified and stored for each wafer 4. Here, for example, the synchronization accuracy data is data indicating an error in relative positions of the reticle stage 2 and the wafer stage 6, occurring in a period when the reticle stage 2 and the wafer stage 6 are synchronously driven in the Y-axis direction in order to expose a target shot area to light. Further, the synchronization accuracy data is acquired by the control unit 16 based on the below-described stage deviation data of the reticle stage 2 and the wafer stage 6 collected during a period when the reticle stage 2 and the wafer stage 6 are driven synchronously. Because an increase in the synchronization accuracy data gives an influence on the overlay performance or the imaging performance, it is possible to judge an abnormality in the exposure apparatus 204 by monitoring the synchronization accuracy data. Further, the illuminance data is a value representing intensity of light incident on the shot area during a period when the shot area is exposed to light. For example, the illuminance data is acquired by the control unit 16 based on a measurement result acquired by a light amount sensor (not illustrated) for measuring light intensity arranged in the illumination optical system 8 during a period when the shot area is exposed to light. Further, the stage deviation data is a value representing a deviation between a target position and a measurement position occurring when at least any one of the reticle stage 2 and the wafer stage 6 is controlled in an exposure period of the wafer 4. The stage deviation data is acquired by the control unit 16 based on the measurement results acquired by the laser interferometers 9 and 10. Further, the alignment measurement data may include waveform data of a digital image signal acquired by capturing an image of a mark formed on a target wafer 4 or data that represents evaluation of the digital image signal (i.e., symmetric property of the waveform data or contrast of the digital image signal). The alignment measurement data is acquired by the control unit 16 based on the measurement result acquired by the alignment scope 15. Further, the collected data is not limited to the synchronization accuracy data, the illuminance data, the stage deviation data, and the alignment measurement data. For example, the collected data may be time-series data, or may include at least any one of a maximum value, a minimum value, an average value, a median value, and a standard deviation acquired from the time-series data. Further, the collected data may include information indicating a principal component vector acquired through principal component analysis. Further, by the control unit 16 of the exposure apparatus 204, the lot data is collected from the respective units or devices of the exposure apparatus 204 and is output to the diagnosis apparatus 300 via the communication device 307. Here, the control unit 16 may output a piece of lot data to the diagnosis apparatus 300 or may collectively output a plurality of pieces of lot data to the diagnosis apparatus 300. Further, the control unit 16 may store the lot data in the storage device 304 and output the lot data stored in the storage device 304. Furthermore, together with the lot data, the control unit 16 may output information for specifying the exposure apparatus 204 or information for specifying a processing condition applied thereto when the lot data is collected.

Referring back to FIG. 5, in step S502, the accumulation unit 402 accumulates the lot data acquired by the acquisition unit 401 in accumulated data (i.e., first information) and stores the lot data in the storage device 304 of the diagnosis apparatus 300. Further, the accumulation unit 402 acquires information for specifying the exposure apparatus 204 and the information for specifying a processing condition from the acquisition unit 401, and classifies and accumulates the lot data for each exposure apparatus 204 or each processing condition. In other words, the accumulation unit 402 accumulates the acquired lot data in data of the exposure apparatus which is the same as the exposure apparatus associated with the acquired lot data and of the processing condition which is the same as the processing condition associated with the acquired data.

Figure 7:
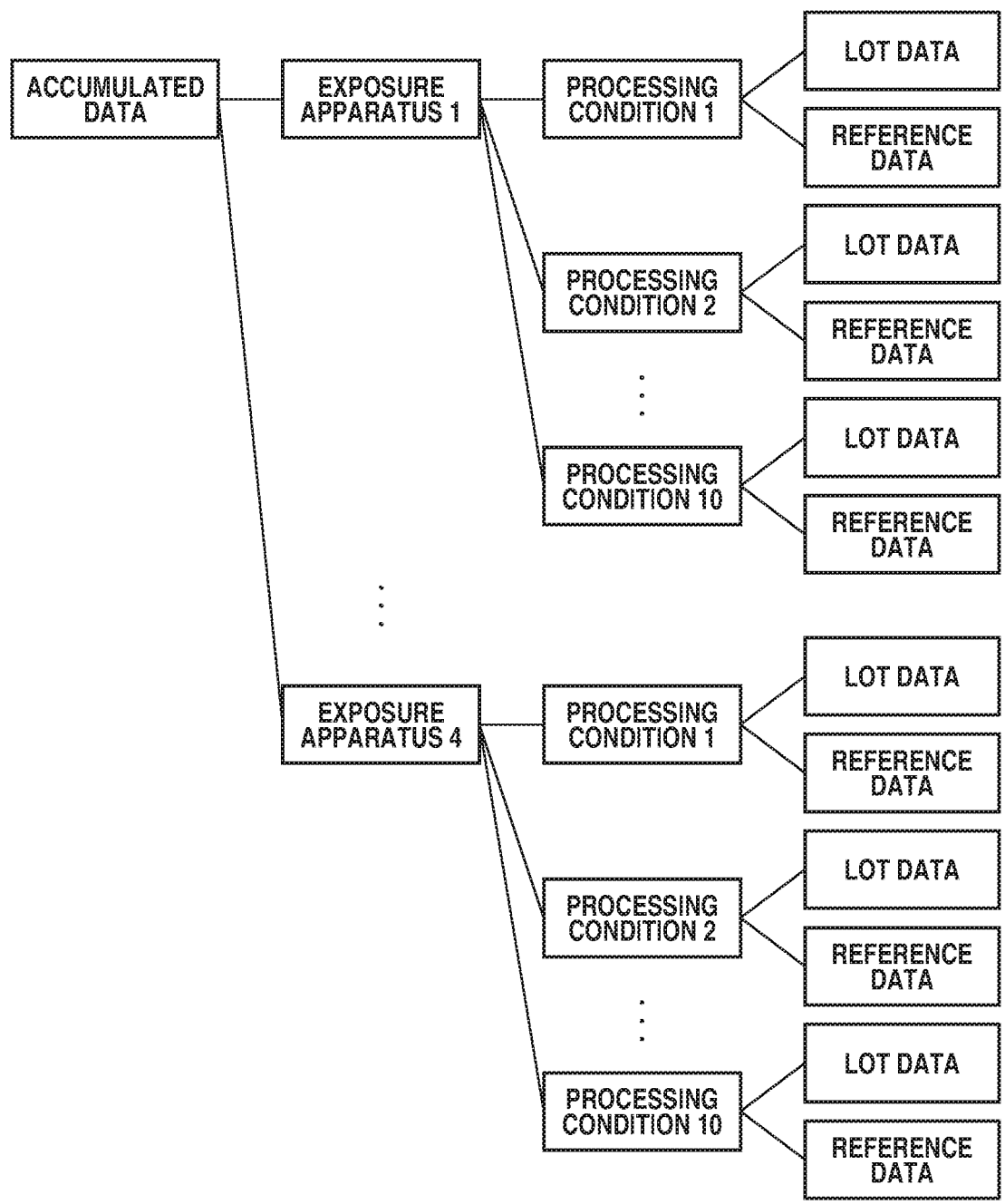
FIG. 7 is a block diagram illustrating accumulated data in which lot data is accumulated.

Here, accumulated data in which the lot data acquired from the plurality of exposure apparatuses 204 is accumulated will be described. FIG. 7 is a diagram illustrating an example of the accumulated data in which the lot data is accumulated. The accumulated data has a hierarchical structure, and lot data acquired from the plurality of exposure apparatuses 204 is classified and accumulated for each exposure apparatus or each processing condition. In a case where exposure processing is executed on a plurality of lots by one exposure apparatus 204 under the same processing condition, a plurality of pieces of lot data may be accumulated under the same processing condition. Further, reference data (second information) including a statistical value of the plurality of pieces of lot data accumulated under the same processing condition is accumulated in the accumulated data. In addition, although the example illustrated in FIG. 7 includes four exposure apparatuses 204 and ten processing conditions, the number of exposure apparatuses or processing conditions is not limited thereto.

Figure 8:
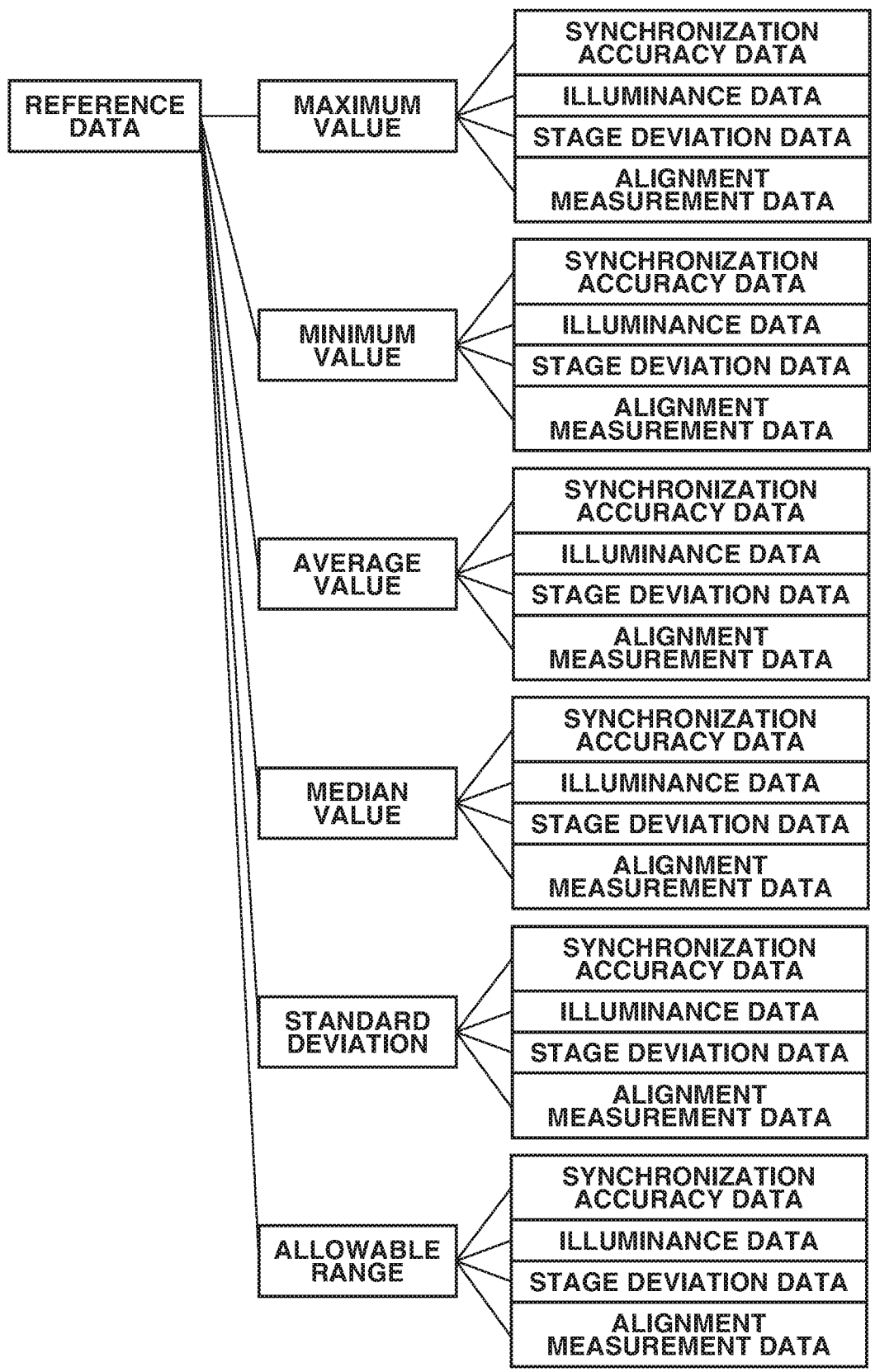
FIG. 8 is a block diagram illustrating reference data accumulated in the accumulated data.

One example of the reference data will be described. FIG. 8 is a diagram illustrating an example of the reference data accumulated in the accumulated data. The reference data includes a maximum value, a minimum value, an average value, a median value, a standard deviation, and an allowable range of collected data for each collected data included in lot data. In the present exemplary embodiment, the allowable range is used for judging an abnormality in the collected data, and an abnormality is judged if the collected data falls outside the allowable range. Further, the reference data may include another statistical value such as a mode value, a variation coefficient, or a variance. Furthermore, data included in the reference data may be time-series data. In addition, as with the case of lot data, data may be included in the reference data for each wafer or each shot area.

Figure 9:
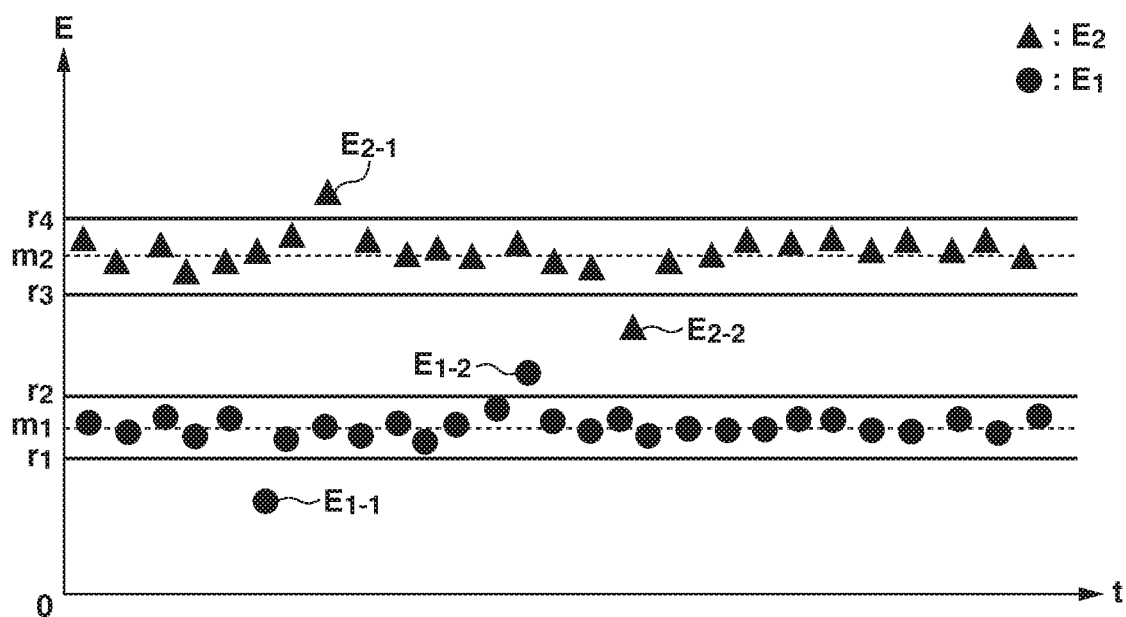
FIG. 9 is a diagram illustrating synchronization accuracy data and an allowable range.

Referring back to FIG. 5, in step S503, the abnormality judgement unit 403 judges an abnormality by using the lot data accumulated by the accumulation unit 402 and the reference data. An abnormality judgement method using synchronization accuracy data from among the plurality of pieces of data included in the lot data will be described as an example. FIG. 9 is a diagram illustrating an example of the synchronization accuracy data and the allowable range. In FIG. 9, pieces of synchronization accuracy data $E_1$ under the processing condition 1 are expressed by black dots, and pieces of synchronization accuracy data $E_2$ under the processing condition 2 are expressed by black triangles. Further, values $m_1$ and $m_2$ respectively represent median values of the synchronization accuracy data $E_1$ and $E_2$. For example, under the processing conditions 1 and 2, a layout of the shot areas on the wafer 4 included in the exposure condition is different from each other, so that there arises a difference between the synchronization accuracy data $E_1$ and the synchronization accuracy data $E_2$. For example, it is assumed that the number of shot areas in the layout under the processing condition 1 is 100, and the number of shot areas in the layout under the processing condition 2 is 50. In this case, paths, speeds, and acceleration rates of the reticle stage 2 and the wafer stage 6 driven for executing the exposure processing are different because sizes of the shot areas are different from each other. When the exposure processing is executed by applying the processing condition 1, a frequency of repeatedly accelerating and decelerating the reticle stage 2 or the wafer stage 6 is increased, so that an interval of repeatedly accelerating and decelerating the reticle stage 2 or the wafer stage 6 will be shorter. Accordingly, when the exposure processing is executed by applying the processing condition 1, a deviation in the reticle stage 2 and the wafer stage 6 is increased. As described above, because the synchronization accuracy data is obtained from the stage deviation data, the median value $m_1$ of the synchronization accuracy data $E_1$ tends to be greater than the median value $m_2$ of the synchronization accuracy data $E_2$. Accordingly, as illustrated in FIG. 9, the synchronization accuracy data is different from each other under the processing conditions 1 and 2. Further, each of the median values $m_1$ and $m_2$ is a value included in the reference data of the same exposure apparatus under the same processing condition. Further, the median values $m_1$ and $m_2$ may be updated when a plurality of pieces of lot data accumulated in the accumulated data is updated. In the synchronization accuracy data illustrated in FIG. 9, if the allowable range of the synchronization accuracy data is set as a range between a value $r_1$ or more and a value $r_4$ or less, the synchronization accuracy data $E_{1\text{-}2}$ and $E_{2\text{-}2}$ are judged as normal although the synchronization accuracy data $E_{1\text{-}1}$ and $E_{2\text{-}1}$ are judged as abnormal. However, when observing the synchronization accuracy data for each processing condition, the synchronization accuracy data $E_{1\text{-}2}$ and $E_{2\text{-}2}$ respectively deviate largely from the median values $m_1$ and $m_2$, so that the synchronization accuracy data $E_{1\text{-}2}$ and $E_{2\text{-}2}$ should be judged as the abnormal synchronization accuracy data. Thus, the abnormality judgement unit 403 can judge the synchronization accuracy data $E_{1\text{-}2}$ and $E_{2\text{-}2}$ as abnormal by setting the allowable range of the synchronization accuracy data $E_1$ to a range between a value $r_1$ or more and a value $r_2$ or less and setting the allowable range of the synchronization accuracy data $E_2$ to a range between a value $r_3$ or more and a value $r_4$ or less. In other words, the abnormality judgement unit 403 can appropriately judge the abnormality by setting the allowable range for each processing condition. Further, the values $r_1$, $r_2$, $r_3$, and $r_4$ for setting the allowable range may be set in advance. Further, the values $r_1$, $r_2$, $r_3$, and $r_4$ for setting the allowable range may be set based on a difference with respect to the median value $m_1$ and $m_2$. More specifically, the respective values $r_1$, $r_2$, $r_3$, and $r_4$ may be set as $r_1=m_1-a$, $r_2=m_1+b$, $r_3=m_2-c$, and $r_4=m_2+d$ (values a, b, c, and d are predetermined positive values). Further, the values $r_1$, $r_2$, $r_3$, and $r_4$ for setting the allowable range may be set based on a ratio with respect to the median value $m_1$ and $m_2$. More specifically, the respective values $r_1$, $r_2$, $r_3$, and $r_4$ may be set as $r_1=em_1$, $r_2=fm_1$, $r_3=gm_2$, and $r_4=hm_2$ (values e, f, g, and h are predetermined positive values which respec-tively satisfy the conditions of $0<e<1$, $f>1$, $0<g<1$, and $h>1$). Further, the values $r_1$, $r_2$, $r_3$, and $r_4$ for setting the allowable range may be acquired through calculation based on the accumulated data. For example, the values $r_1$, $r_2$, $r_3$, and $r_4$ for setting the allowable range may be set based on a standard deviation calculated from data judged as normal from among the lot data of the accumulated data. More specifically, the respective values $r_1$, $r_2$, $r_3$, and $r_4$ may be set as $r_1=m_1-\sigma_1$, $r_2=m_1+\sigma_1$, $r_3=m_2-\sigma_2$, and $r_4=m_2+\sigma_2$ (values $\sigma_1$ and $\sigma_2$ are standard deviations). Further, although the allowable range is set by making the median value $m_1$ or $m_2$ as a reference, another statistical value such as a maximum value, a minimum value, or an average value may be used as a reference. Further, although the reference data is described as the reference data obtained under the same processing condition from the same exposure apparatus as the exposure apparatus from which the lot data is acquired, the exposure apparatus as a reference may be an exposure apparatus different from the exposure apparatus from which the lot data is acquired under the same processing condition. Further, although the synchronization accuracy data of the present exemplary embodiment has been described, an abnormality is judged for each collected data if a plurality of pieces of collected data is included in the lot data.

Referring back to FIG. 5, in step S504, if an abnormality is judged as a result of the judgement in step S503 (YES in step S504), the processing proceeds to step S505. If an abnormality is not judged (NO in step S504), the processing proceeds to step S506. In step S505, the abnormality judgement unit 403 stores, in the storage device 304 of the diagnosis apparatus 300, the information for specifying the exposure apparatus 204 from which the lot data judged as abnormal is acquired. Further, together with the information for specifying the exposure apparatus 204, the abnormality judgement unit 403 stores related data such as a processing condition of the lot data judged as abnormal and the collected data (e.g., synchronization accuracy data) judged as abnormal in the storage device 304 of the diagnosis apparatus 300.

In step S506, the accumulation unit 402 updates the reference data based on the plurality of pieces of lot data accumulated already and newly-accumulated lot data. For example, if the data to be update is based on a statistical value, the accumulation unit 402 calculates the statistical value and updates the reference data based on the plurality of pieces of lot data accumulated already and the newly-accumulated lot data. Further, if there is a plurality of pieces of collected data for which abnormalities are to be judged, the processing in steps S501 to S506 is repeatedly executed by the number of pieces of collected data.

Figure 10:
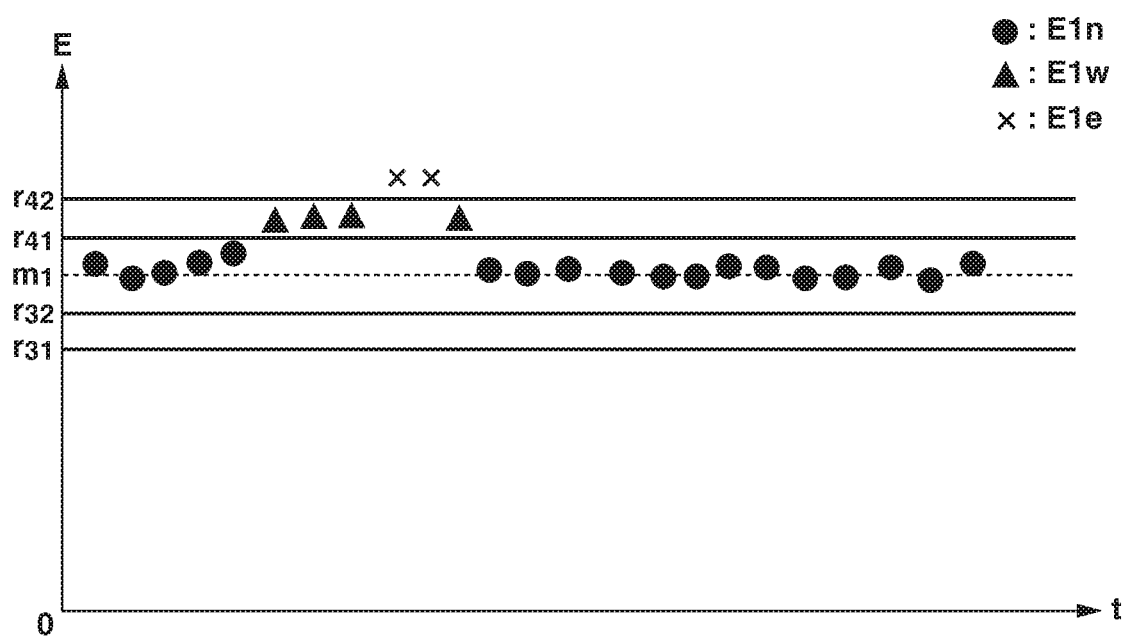
FIG. 10 is a diagram illustrating synchronization accuracy data and a plurality of allowable ranges.

Further, in step S503, the abnormality judgement unit 403 can judge abnormalities classified into gradual levels by setting a plurality of allowable ranges. FIG. 10 is a diagram illustrating examples of synchronization accuracy data and a plurality of allowable ranges. In FIG. 10, with respect to the synchronization accuracy data $E_1$ under the processing condition 1, a plurality of allowable ranges are set by using values $r_{31}$, $r_{32}$, $r_{41}$, and $r_{42}$ for setting the allowable ranges. The abnormality judgement unit 403 judges pieces of synchronization accuracy data $E_{1n}$ (represented by black dots) falling within the allowable range between the value $r_{32}$ or more and the value $r_{41}$ or less as normal. Further, the abnormality judgement unit 403 judges pieces of synchronization accuracy data $E_{1w}$ (represented by black triangles) falling within the allowable range between the value $r_{31}$ or more and the value $r_{32}$ or less and the allowable range between the value $r_{41}$ or more and the value $r_{42}$ or less as slightly abnormal. Further, the abnormality judgement unit 403 judges pieces of synchronization accuracy data $E_{1e}$ (represented by cross marks) falling within a range less than the value $r_{31}$ and a range greater than the value $r_{42}$ as considerably abnormal. With this configuration, the abnormality judgement unit 403 can judge the abnormalities classified into stepwise levels. For example, as with the case of the respective values for setting the allowable range illustrated in FIG. 9, the values $r_{31}$, $r_{32}$, $r_{41}$, and $r_{42}$ for setting the allowable ranges may be set in advance, or may be acquired through calculation. For example, the values $r_{31}$, $r_{32}$, $r_{41}$, and $r_{42}$ for setting the allowable ranges may be set based on a standard deviation calculated from data judged as normal from among pieces of the lot data of the accumulated data. For example, the respective values $r_{31}$, $r_{32}$, $r_{41}$, and $r_{42}$ may be set as $r_{31}=m_1-i\sigma_1$, $r_{32}=m_1-j\sigma_1$, $r_{41}=m_1+j\sigma_1$, and $r_{42}=m_1+i\sigma_1$, where the value $\sigma_1$ standard deviation, and the values i and j are positive values which satisfy the condition i>j.

Next, a method of determining a maintenance method for maintaining the exposure apparatus 204 from which the lot data judged as abnormal by the diagnosis apparatus 300 is acquired will be described. The maintenance unit 404 determines a maintenance method for maintaining the exposure apparatus 204 from which the lot data judged as abnormal by the abnormality judgement unit 403 is acquired. Here, a relationship between an abnormality judged in collected data and a maintenance method will be described. FIG. 11 is a table illustrating a relationship between a judged abnormality and a maintenance method. For example, with respect to an abnormality in synchronization accuracy judged in synchronization accuracy data, a filter adjustment or a control parameter adjustment may be selected as a maintenance method. The filter adjustment is a maintenance method for reducing the vibration arising in the wafer stage 6 or the reticle stage 2, and a filter that removes the vibration of a certain frequency component from an instruction value for controlling the wafer stage 6 or the reticle stage 2 is adjusted thereby. The control parameter adjustment is a maintenance method for adjusting a control parameter of the driving characteristic of the wafer stage 6 or the reticle stage 2 by the control unit 16.

Further, with respect to an abnormality in illuminance judged in illuminance data, a slit adjustment or an optical axis adjustment may be selected as a maintenance method. The slit adjustment is a maintenance method for adjusting a slit included in the illumination optical system 8, so that exposure light is uniformly emitted when a shot area on the wafer 4 is to be exposed to light. The optical axis adjustment is a maintenance method for adjusting a telecentric state inside or outside the optical axis of the illumination optical system 8.

Further, for an abnormality in alignment measurement judged in the alignment measurement data, sample shot search, alignment illumination system optimization, or template update may be selected as a maintenance method. The sample shot search is a maintenance method in which the control unit 16 drives the wafer stage 6 and searches for another alignment mark at a specified alternative position on the wafer 4 to execute positioning by observing the wafer 4 through the alignment scope 15. Further, the alignment illumination system optimization is a maintenance method for adjusting an alignment illumination system to increase the detection accuracy of the alignment mark. The template update is a maintenance method for automatically updating a template so as to improve a correlation by the control unit 16 when the alignment mark is detected through template matching.

Figure 12:
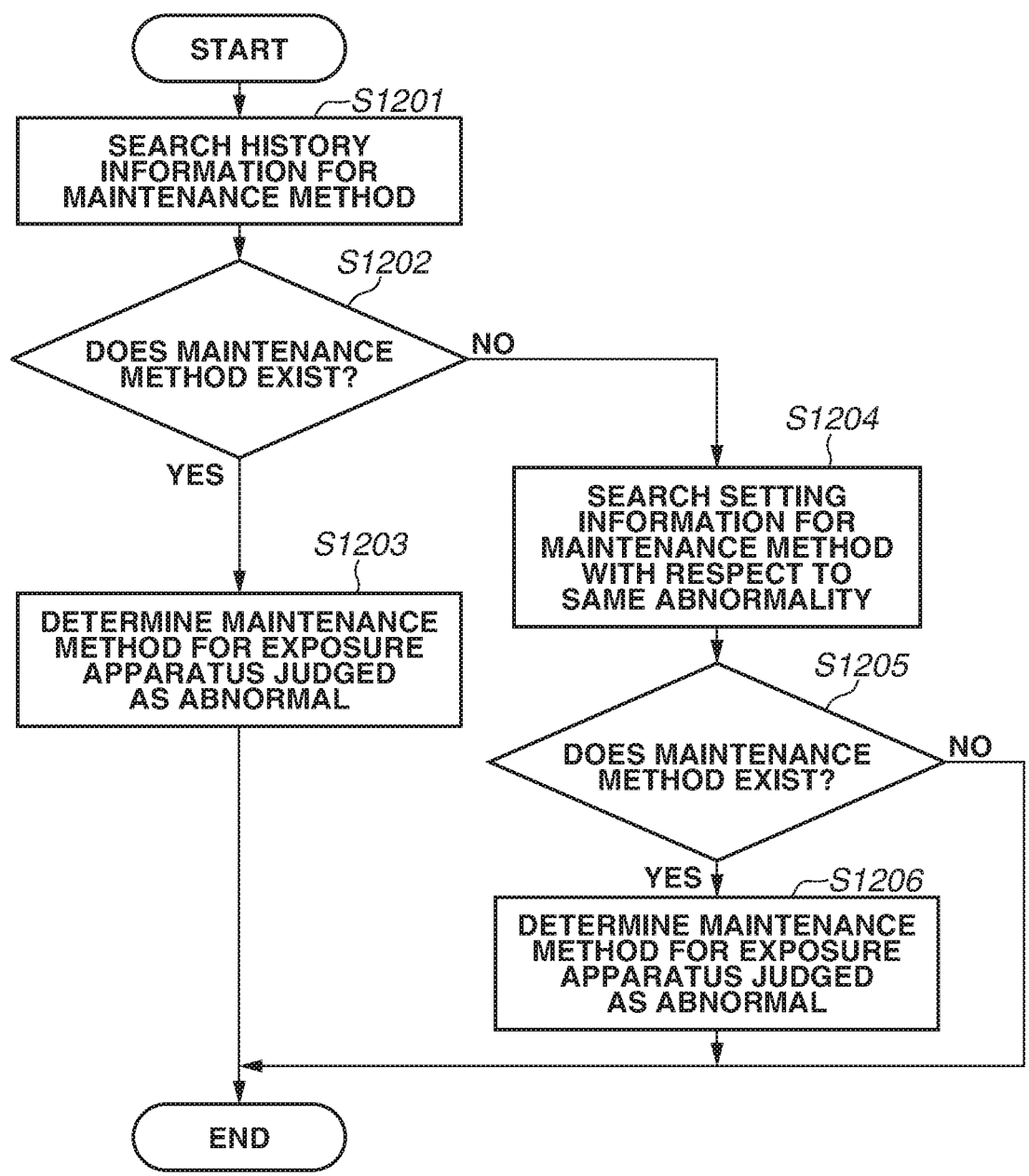
FIG. 12 is a flowchart illustrating a method of determining a maintenance method.

FIG. 12 is a flowchart illustrating a method for determining a maintenance method. In step S1201, the maintenance unit 404 searches history information (third information) for a maintenance method corresponding to the collected data judged as abnormal. Here, the history information will be described. FIG. 13 is a table illustrating an example of the history information. The history information may include information such as an abnormality type judged based on the collected data, date and time the collected data judged as abnormal is collected, an exposure apparatus from which the collected data judged as abnormal is collected, and a processing condition 1 or 2 applied when the collected data is collected. The history information may further include information such as a maintenance method executed for solving an abnormality and an execution result (i.e., "success" or "failure") indicating whether the executed maintenance method solves the abnormality. In other words, information about a maintenance method that has been executed for an abnormality occurred in an exposure apparatus in the past and an execution result of that maintenance method are recorded in the history information together with information about an exposure apparatus and a processing condition. Further, as with the case of lot data, the history information is acquired by the acquisition unit 401 of the diagnosis apparatus 300 and accumulated by the accumulation unit 402.

Referring back to FIG. 12, in step S1201, the maintenance unit 404 searches history information for a maintenance method using such a search condition that data that describes "success" as an execution result from among the maintenance methods executed for the same abnormality occurring in the same exposure apparatus under the same processing condition. For example, as illustrated in FIG. 13, it is assumed that an abnormality in synchronization accuracy has occurred in an exposure apparatus 1 when exposure processing is executed by applying a processing condition 1. In this case, the maintenance unit 404 searches the history information for a maintenance method using such a search condition that data that describes "success" as an execution result of a maintenance method executed for the abnormality in synchronization accuracy occurring in the exposure apparatus 1 under the processing condition 1. In the example illustrated in FIG. 13, data listed in the first row is data matching the search condition, so that the filter adjustment is selected as the maintenance method. Here, if there are pieces of data matching the search condition, a maintenance method included in data having recent date and time or a maintenance method which results in success for a larger number of times in the plurality of data may be preferentially selected as a maintenance method matching the search condition. Further, at this time, although data including the same abnormality, the same exposure apparatus, and the same processing condition has been set as the search condition, data in which at least one of these items, i.e., the abnormality, the exposure apparatus, and the processing condition, is the same may be set as the search condition.

In step S1202, the maintenance unit 404 judges whether a maintenance method matching the search condition exists. If the maintenance unit 404 judges that a maintenance method matching the search condition exists (YES in step S1202), the processing proceeds to step S1203. In step S1203, the maintenance unit 404 determines the found maintenance method as the maintenance method of the exposure apparatus from which the collected data judged as abnormal is collected. Further, in step S1202, if the maintenance unit 404 judges that the maintenance method matching the search condition does not exist (NO in step S1202), the processing proceeds to step S1204.

In step S1204, the maintenance unit 404 searches the information indicating a relationship between a predetermined abnormality and a maintenance method for a maintenance method corresponding to the judged abnormality. For example, if a relationship illustrated in FIG. 11 is determined in advance, filter adjustment and control parameter adjustment are found as the maintenance methods corresponding to the abnormality in synchronization accuracy. If a plurality of maintenance methods is found, a preset default maintenance method may be selected. For example, if control parameter adjustment is set as the default maintenance method, the control parameter adjustment is selected as a maintenance method. Further, a maintenance method stored in the history information and executed more frequently may be selected. For example, in the example in FIG. 12, filter adjustment as a maintenance method that is executed most frequently for the abnormality in synchronization accuracy is selected as a maintenance method. In step S1205, the maintenance unit 404 judges whether a maintenance method matching the search condition exists. If the maintenance unit 404 judges that a maintenance method matching the search condition exists (YES in step S1205), the processing proceeds to step S1206. In step S1206, the maintenance unit 404 determines the found maintenance method as the maintenance method of the exposure apparatus from which the collected data judged as abnormal is collected. Further, in step S1205, if the maintenance unit 404 judges that the maintenance method matching the search condition does not exist (NO in step S1205), the processing is ended.

The output unit 405 outputs an instruction (command) for executing the maintenance method determined by the maintenance unit 404 in step S1203 or S1206 to the lithography apparatus (i.e., exposure apparatus) from which the collected data judged as abnormal is collected. The lithography apparatus that receives the instruction executes the maintenance method in response to the instruction. Further, in step S1205, if the maintenance unit 404 judges that the maintenance method does not exist (NO in step S1205), the output unit 405 may output an instruction for causing the lithography apparatus from which the collected data judged as abnormal is collected to output an error or a warning. Further, if the maintenance unit 404 judges that the maintenance method does not exist in step S1205, the output unit 405 may output an instruction for causing the lithography apparatus from which the collected data judged as abnormal is collected to output a procedure for manually executing maintenance.

As described above, in the present exemplary embodiment, the abnormality is judged based on the data accumulated for each processing condition applied to the lithography apparatus, so that an abnormality occurring in the lithography apparatus can be judged precisely. Further, a maintenance method is determined for the judged abnormality based on the history information including information about an executed maintenance method and its execution result, so that a maintenance method capable of solving the abnormality can be executed.

In a second exemplary embodiment, an example of processing for determining a maintenance method by using factor analysis of an abnormality will be described. In addition, a configuration that is not described below may be similar to that of the first exemplary embodiment.

Figure 14:
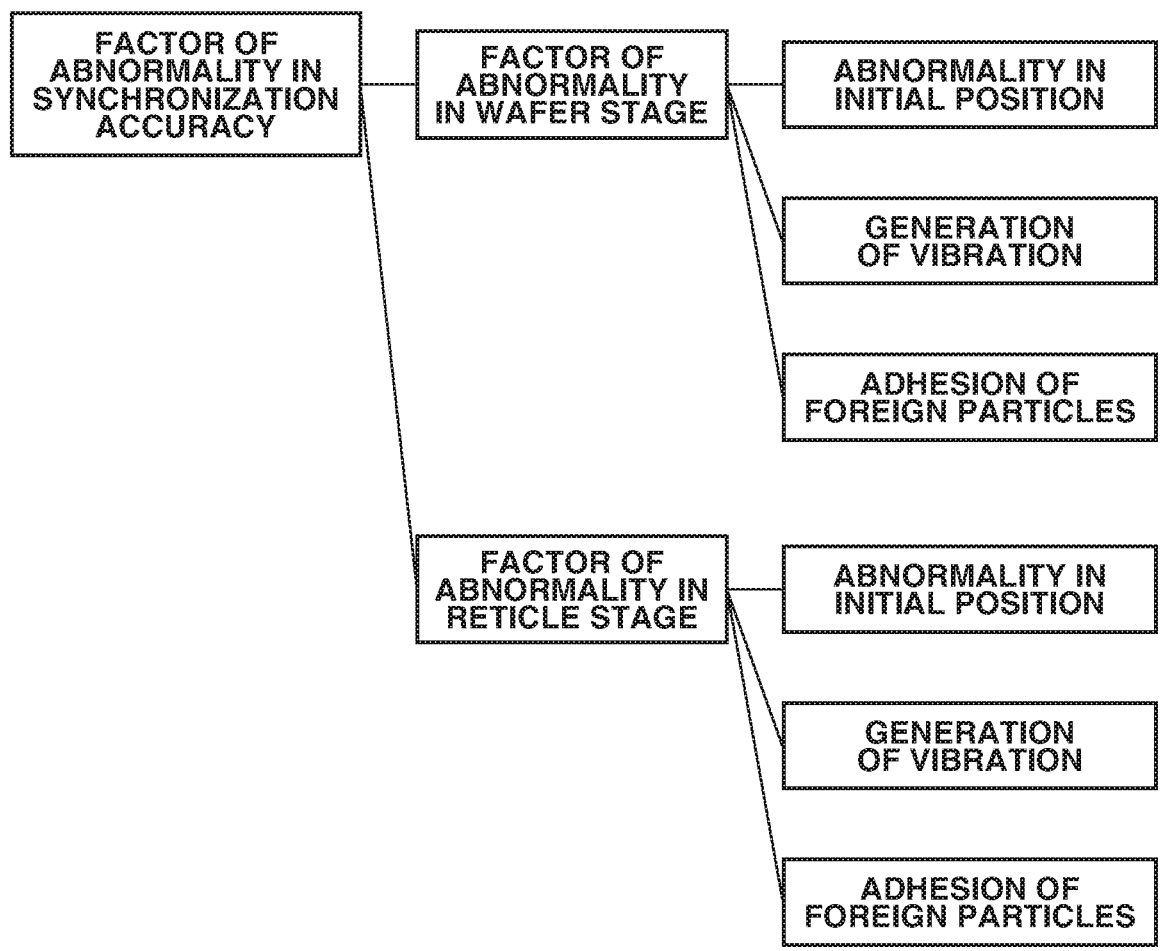
FIG. 14 is a block diagram illustrating a factor of an abnormality in synchronization accuracy.

Factor analysis of the abnormality judged by the abnormality judgement unit 403 will be described. In the present exemplary embodiment, an abnormality in synchronization accuracy will be described as an example of a detected abnormality. FIG. 14 is a diagram illustrating a relationship between an abnormality and a factor of the abnormality. First, a factor of the abnormality in synchronization accuracy is classified into a factor of the abnormality in the wafer stage 6 and a factor of the abnormality in the reticle stage 2. An abnormality in an initial position, generation of vibration, and adhesion of foreign particles are considered as the factors of abnormalities in the wafer stage 6. The abnormality in the initial position refers to a state where an error of the initial position of the wafer stage 6 at the time of starting the exposure processing for each shot area falls outside the allowable range. Further, generation of vibration refers to a state where vibration is generated in the wafer stage 6. Further, adhesion of foreign particles refers to a state where foreign particles are adhered to the substrate or the wafer chuck 5. The same can apply to the factors of the abnormalities in the reticle stage 2.

Subsequently, a maintenance method for executing maintenance with respect to the factors specified by the factor analysis will be described. FIG. 15 is a flowchart illustrating a method for determining a maintenance method by using the factor analysis. In step S1501, the maintenance unit 404 acquires collected data judged as abnormal. At this time, it is assumed that the judged abnormality is the abnormality in synchronization accuracy, and the acquired collected data is the stage deviation data.

Figure 16A:
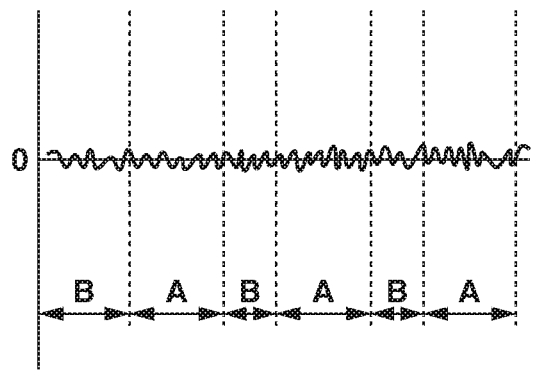
FIGS. 16A, 16B, 16C, and 16D are waveform charts illustrating waveforms of deviations arising in a wafer stage.
Figure 16B:
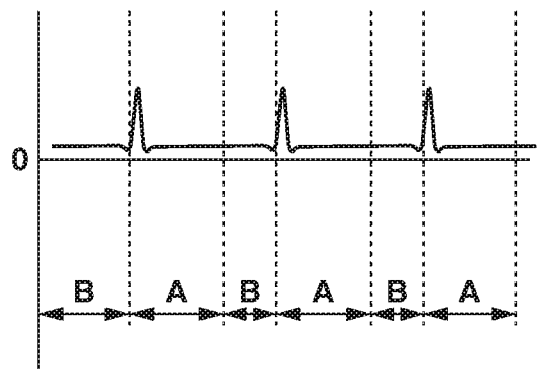
Figure 16C:
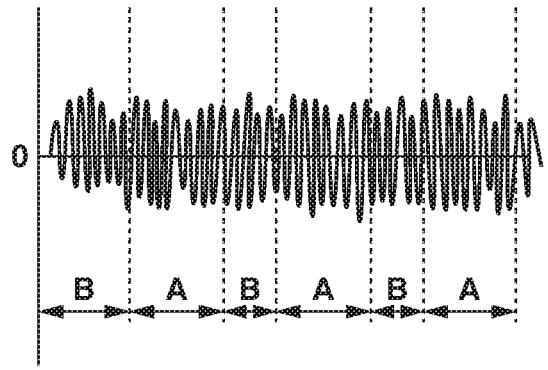
Figure 16D:
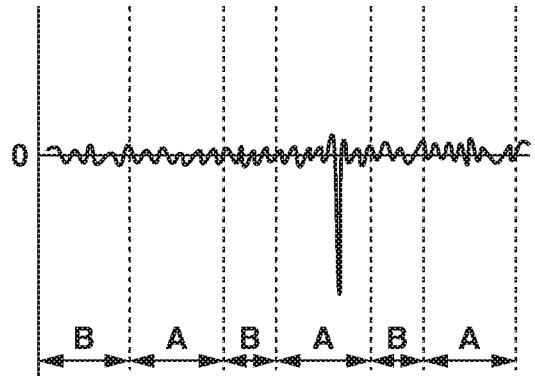

Now, the stage deviation data will be described in a case where the exposure apparatus 204 is a scanner. FIGS. 16A to 16D are graphs each illustrating an example of a waveform of a deviation in the wafer stage 6. In each of the graphs in FIGS. 16A to 16D, a vertical axis represents a deviation and a horizontal axis represents time. Each of the graphs in FIGS. 16A to 16D illustrates a waveform of a deviation during a period when exposure processing is sequentially executed on a plurality of shot areas on the wafer 4. In each of FIGS. 16A to 16D, sections defined by dotted lines represent a period A in which the exposure processing is executed on a shot area and a period B in which the exposure processing is not executed. Because scanning-exposure processing is executed in the period A, the wafer stage 6 is driven and moved at a uniform speed. Further, in the period B, in order to move an exposure area to the next shot area, the wafer stage 6 is driven and moved at an accelerated speed. FIG. 16A is a graph illustrating a state where the wafer stage 6 is controlled normally, so that the abnormality does not occur in the synchronization accuracy. FIG. 16B is a graph illustrating a state where the abnormality occurs in the synchronization accuracy because of the abnormality in the initial position. When a factor of the abnormality is an abnormality in the initial position, a large deviation occurs at the beginning of the period A. FIG. 16C is a graph illustrating a state where the abnormality occurs in the synchronization accuracy because of generation of vibration. When a factor of the abnormality is generation of vibration, a waveform of the deviation oscillates at a large amplitude over the entire period. Further, FIG. 16D is a graph illustrating a state where foreign particles adheres to the wafer chuck 5, so that the abnormality occurs in the synchronization accuracy because of adhesion of the foreign particles. When a factor of the abnormality is a substrate, a considerable change occurs in a waveform of the deviation irregularly. As described above, a waveform of the deviation in the wafer stage 6 has characteristics depending on the factors of the abnormalities in synchronization accuracy, so that the diagnosis apparatus 300 can estimate the factor of the abnormality in synchronization accuracy from the characteristics of the waveform of the deviation in the wafer stage 6.

Referring back to FIG. 15, in step S1502, the maintenance unit 404 analyzes the collected data and estimates the factor of the occurring abnormality. A known technique such as factor estimation using a correlation coefficient or factor estimation using frequency analysis may be used as a method for estimating the factor of the abnormality. Furthermore, a method such as a decision tree, a random forest, a support vector machine, or a neural network may be employed by using the information about the collected data. In step S1503, the maintenance unit 404 searches the information (fourth information) about a relationship between the factor of the abnormality and the maintenance method for the maintenance method corresponding to the estimated factor.

Next, a relationship between a factor of an abnormality and a maintenance method will be described. FIG. 17 is a table illustrating a relationship between a factor of an abnormality and a maintenance method. In step S1502, in a case where an abnormality in the initial position is estimated as a factor, control parameter adjustment corresponds to the maintenance method. Further, in a case where generation of vibration is estimated as a factor, filter adjustment corresponds to the maintenance method. Furthermore, in a case where adhesion of foreign particles is estimated as a factor, chuck cleaning corresponds to the maintenance method. A relationship between a factor of an abnormality and a maintenance method in FIG. 17 is one example, and a relationship between a factor of an abnormality and a maintenance method is not limited to the example illustrated in FIG. 17.

Referring back to FIG. 15, in step S1504, the maintenance unit 404 judges whether a maintenance method corresponding to the estimated factor exists. If the maintenance method exists (YES in step S1504), the processing proceeds to step S1505. If the maintenance method does not exist (NO in step S1504), the processing is ended. In step S1505, the maintenance unit 404 determines the found maintenance method as the maintenance method of the exposure apparatus from which the collected data judged as abnormal is collected.

Although the wafer stage 6 is described according to the present exemplary embodiment, a maintenance method can be similarly determined for the reticle stage 2. Further, the determination method of the maintenance method described in the present exemplary embodiment may be executed in place of the determination method of the maintenance method described in the first exemplary embodiment, or the determination method of the maintenance method in the present exemplary embodiment may be executed in combination with the determination method of the maintenance method described in the first exemplary embodiment. In this case, a maintenance method may be determined by setting priorities to the maintenance methods determined through the two determination methods. Alternatively, a plurality of maintenance methods may be output to the exposure apparatus 204, so that a maintenance method may be selected by the exposure apparatus 204.

As described above, a maintenance method is determined by estimating a factor of the abnormality in the lithography apparatus, so that a maintenance method capable of solving the abnormality can be determined.

Next, a lithography system according to a third exemplary embodiment will be described. In addition, a configuration not described below is similar to that of the first or the second exemplary embodiment.

Figure 18:
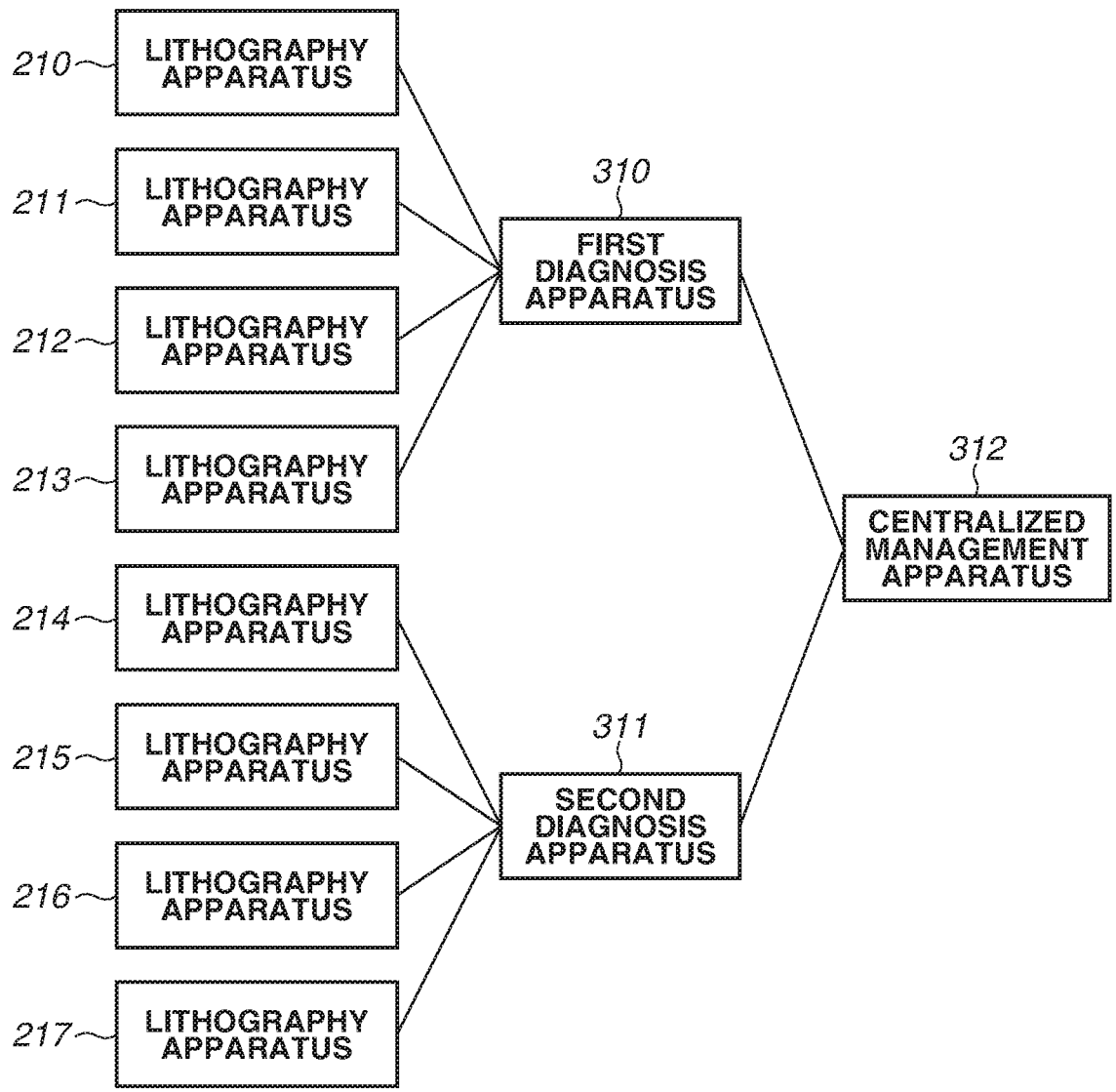
FIG. 18 is a block diagram illustrating a lithography system configured of a plurality of diagnosis apparatuses and a centralized management apparatus.

The lithography system according to the present exemplary embodiment includes a plurality of diagnosis apparatuses and a centralized management apparatus. FIG. 18 is a block diagram illustrating an example of the lithography system including a plurality of diagnosis apparatuses and a centralized management apparatus. A lithography system 101 according to the present exemplary embodiment includes lithography apparatuses 210 to 217, a first and a second diagnosis apparatuses 310 and 311 for judging abnormalities in the lithography apparatuses 210 to 217 to determine maintenance methods for maintaining the lithography apparatuses 210 to 217, and a centralized management apparatus 312. The lithography apparatuses 210 to 213 are connected to the first diagnosis apparatus 310, and the lithography apparatuses 214 to 217 are connected to the second diagnosis apparatus 311. The first diagnosis apparatus 310 and the second diagnosis apparatus 311 are connected to the centralized management apparatus 312. In FIG. 18, although the lithography apparatuses 210 to 217 are arranged, the number of lithography apparatuses is not limited to 8. Further, in FIG. 18, although the first diagnosis apparatus 310 and the second diagnosis apparatus 311 are arranged, the number of diagnosis apparatuses is not limited to 2.

The first diagnosis apparatus 310, the second diagnosis apparatus 311, and the centralized management apparatus 312 are the information processing apparatuses described in the first exemplary embodiment. The centralized management apparatus 312 acquires lot data of the lithography apparatuses 210 to 217 via the first diagnosis apparatus 310 and the second diagnosis apparatus 311, and stores the lot data in the storage device 304 as accumulated data. Further, the centralized management apparatus 312 similarly acquires history information to store the history information in the storage device 304. Based on the accumulated data and the history information, the centralized management apparatus 312 acquires reference data, data for setting the allowable range of the collected data, data indicating a correspondence between an abnormality and a maintenance method, and data indicating a correspondence between a factor of an abnormality and a maintenance method. The centralized management apparatus 312 outputs the acquired information such as the reference data to the first diagnosis apparatus 310 and the second diagnosis apparatus 311. Based on the information such as the reference data acquired from the centralized management apparatus 312, the first diagnosis apparatus 310 and the second diagnosis apparatus 311 judge the abnormalities in the lithography apparatuses 210 to 217 and determine the maintenance methods. Each of the first and the second diagnosis apparatuses 310 and 311 can use the information such as the reference data acquired based on the lot data or the history information acquired from the other lithography apparatuses connected to another diagnosis apparatus.

The centralized management apparatus 312 may periodically output the information such as the reference data to the first diagnosis apparatus 310 and the second diagnosis apparatus 311, or may output the information in response to a request from the first diagnosis apparatus 310 or the second diagnosis apparatus 311.

As described above, it is possible to precisely judge the abnormality occurring in the lithography apparatus and execute a maintenance method for solving the abnormality.

<Manufacturing Method of Article>

A manufacturing method of an article according to the present exemplary embodiment is preferable for manufacturing an article, for example, a device such as a semiconductor device, a magnetic storage medium, and a liquid crystal display element. Such a manufacturing method includes a step of exposing a substrate on which a photosensitive agent is applied, to light (i.e., a pattern is formed on a substrate), and a step of developing the exposed substrate (i.e., the substrate is processed), by using an exposure apparatus. Further, such a manufacturing method includes a step of bringing an imprint material supplied on a substrate into contact with a mold, and forming a composition on which a shape of the mold is transferred, by using an imprint apparatus. Furthermore, such a manufacturing method may include other known steps, for example, oxidizing, film formation, vapor deposition, doping, planarization, etching, resist removing, die cutting, bonding, and packaging. In comparison with the conventional manufacturing method, the manufacturing method of an article according to the present exemplary embodiment is advantageous in at least one of performance, quality, productivity, and production cost of the article.

Although the exemplary embodiments of the present invention have been described above, it is a matter of course that the present invention is not limited to the above-described exemplary embodiments, and various variations and modifications are possible within the scope of the present invention. Although the exposure apparatus has been described as an example of the lithography apparatus, the present invention is not limited thereto.

An imprint apparatus, which brings an imprint material supplied on a substrate into contact with a mold to form a composition on which a shape of the mold is transferred, may be also given as an example of the lithography apparatus. Further, a drawing apparatus, which executes drawing on a substrate with a charged-particle beam (e.g., an electron beam or an ion beam) via a charged-particle optical system to form a pattern on the substrate, may be given as an example of the lithography apparatus. Further, the lithography apparatus may also include a manufacturing apparatus such as an application apparatus for applying a photosensitive medium on a surface of a substrate or a development apparatus for developing a substrate on which a pattern is transferred, which executes processing other than the processing executed by the above-described apparatus such as the imprint apparatus in the manufacture of an article such as a device.

Further, the first to the third exemplary embodiments can be implemented by combining the first to the third exemplary embodiments, in addition to being implemented independently.

According to the present invention, it is possible to provide an information processing apparatus capable of precisely judging an abnormality occurring in a lithography apparatus, a judgement method, a program, a lithography apparatus, a lithography system, and a manufacturing method of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-113942, filed Jun. 14, 2018, which is hereby incorporated by reference herein in its entirety.

What is claimed is:

1. An information processing apparatus, comprising:
a first acquisition unit configured to acquire first collected data indicating a result of lithographic processing that is executed by applying a first processing condition for controlling a lithography apparatus to execute lithographic processing for forming a pattern, and second collected data indicating a result of lithographic processing that is executed by applying a second processing condition for controlling the lithographic apparatus at least partially different from the first processing condition,
a second acquisition unit configured to acquire a first allowable range based on the first collected data and acquire a second allowable range at least partially different from the first allowable range based on the second collected data;
a judgement unit configured to judge that an abnormality has occurred in collected data indicating a result of lithographic processing that is executed by applying the first processing condition in a case where the collected data is not within the first allowable range, and judge that an abnormality has occurred in collected data indicating a result of lithographic processing that is executed by applying the second processing condition in a case where the collected data is not within the second allowable range.

2. The information processing apparatus according to claim 1, further comprising a determination unit configured to determine:
a maintenance method for maintaining the lithography apparatus in a case were the judgment unit judges that an abnormality has occurred in the collected data.

3. The information processing apparatus according to claim 2, wherein the determination unit is configured to determine, in a case where the judgement unit judges that an abnormality has occurred in the collected date, a maintenance method based on:
- a factor of the abnormality occurring in the collected data, and
- a maintenance method corresponding to the factor of the abnormality executed for maintaining the lithography apparatus.

4. The information processing apparatus according to claim 2, wherein the determination unit is configured to determine, in a case where the judgement unit judges that an abnormality has occurred in the collected data, a maintenance method based on:
- a type of the abnormality,
- a processing condition applied to lithography processing executed when the collected data is collected,
- a maintenance method executed for maintaining the lithography apparatus, and
- an execution result corresponding to the maintenance method.

5. The information processing apparatus according to claim 2, further comprising an output unit configured to output a command for executing the maintenance method determined by the determination unit.

6. The information processing apparatus according to claim 2, further comprising an update unit configured to update the first allowable range based on the collected data indicating the result of the lithographic processing that is executed by applying the first processing condition in a case where the collected data indicating the result of the lithographic processing that is executed by applying the first processing condition is acquired, and update the second allowable range based on the collected data indicating the result of the lithographic processing that is executed by applying the second processing condition in a case where the collected data indicating the result of the lithographic processing that is executed by applying the second processing condition is acquired.

7. The information processing apparatus according to claim 1, wherein the collected data indicating the result of the lithographic processing includes stage deviation data indicating a deviation between a target position and a measurement position occurring when the stages included in the lithography apparatus are controlled.

8. The information processing apparatus according to claim 1, wherein the collected data indicating the result lithographic processing includes alignment measurement data relating an image signal acquired by capturing an image of a mark formed on a substrate on which the pattern is formed.

9. The information processing apparatus according to claim 1, wherein the first allowable range and the second allowable range are acquired by using an average value and a standard deviation of the classified collected data, or a median value and a standard deviation of the collected data indicating the result of the lithographic processing.

10. The information processing apparatus according to claim 1, wherein the first allowable range and the second allowable range are obtained by using any one of:
- a difference from an average value of the collected data indicating the result of the lithographic processing,
- a difference from a median value of the collected data indicating the result of the lithographic processing,
- a ratio with respect to the average value, and a ratio with respect to the median value.

11. The information processing apparatus according to claim 1, wherein the first allowable range and the second allowable range includes a plurality of allowable ranges, and abnormalities classified into stepwise levels are judged.

12. The information processing apparatus according to claim 1, wherein the first processing condition and the second processing condition includes at least one of:
- a conveyance condition,
- a positioning condition,
- a measurement condition,
- an exposure condition, and
- a setup condition,
  wherein the first processing condition and the second processing condition are different from each other in at least one of a conveyance condition, a positioning condition, a measurement condition, an exposure condition, and a setup condition.

13. The information processing apparatus according to claim 1, wherein the first acquisition unit is configured to acquire the first collected data and the second collected data indicating the results of the lithographic processing from a plurality of lithography apparatuses, and the second acquisition unit is configured to acquire the first allowable range and the second allowable range for each of the lithography apparatuses.

14. The information processing apparatus according to claim 1, wherein the first processing condition is determined before the lithographic processing by applying the first processing condition is executed and the second processing condition is determined before the lithographic processing by applying the second processing condition is executed.

15. The information processing apparatus according to claim 1, wherein the collected data indicating the result of the lithographic processing includes synchronization accuracy data indicating an error in relative positions of a plurality of stages included in the lithography apparatus.

16. The information processing apparatus according to claim 1, wherein the collected data indicating the result of the lithographic processing includes illuminance data indicating illuminance of light emitted from an optical system included in the lithography apparatus.

17. A judgement method comprising:
- acquiring first collected data indicating a result of lithographic processing that is executed by applying a first processing condition for controlling a lithography apparatus to execute lithographic processing for forming a pattern, and a second collected data indicating a result of lithographic processing that is executed by applying a second processing condition for controlling the lithographic apparatus at least partially different from the first processing condition;
- acquiring a first allowable range based on the first collected data and acquire a second allowable range at least partially different from the first allowable range based on the second collected data;
- judging that an abnormality has occurred in collected data indicating a result of lithographic processing that is executed by applying the first processing condition in a case where the collected data is not within the first allowable range, and judging that an abnormality has occurred in collected data indicating a result of lithographic processing that is executed by applying the second processing condition in a case where the collected data is not within the second allowable range.

18. The judgement method according to claim 17, wherein the first processing condition is determined before the lithographic processing by applying the first processing condition is executed and the second processing condition is determined before the lithographic processing by applying the second processing condition is executed.

19. A non-transitory computer readable storage medium storing a program for causing a computer to execute a judgement method, the judgement method comprising:
acquiring first collected data indicating a result of lithographic processing that is executed by applying a first processing condition for controlling a lithography apparatus to execute lithographic processing for forming a pattern, and second collected data indicating a result of lithographic processing that is executed by applying a second processing condition for controlling the lithographic apparatus at least partially different form the first processing condition,
acquiring a first allowable range based on the first collected data and acquiring a second allowable range at least partially different form the first allowable range based on the second collected data;
judging that an abnormality has occurred in the collected data indicating a result of lithographic processing that is executed by applying the first processing condition in a case where the collected data is not within the first allowable range, and judging that an abnormality has occurred in collected data indicating a result of lithographic processing that is executed by applying the second processing condition in a case where the collected data is not within the second allowable range.

20. The non-transitory computer readable storage medium according to claim 19, wherein the first processing condition is determined before the lithographic processing by applying the first processing condition is executed and the second processing condition is determined before the lithographic processing by applying the second processing condition is executed.

21. A lithography system comprising:
a lithography apparatus configured to form a pattern on a substrate, and
an information processing apparatus including:
a first acquisition unit configured to acquire first collected data indicating a result of lithographic processing that is executed by applying a first processing condition for controlling the lithography apparatus to execute lithographic processing for forming a pattern, and second collected data indicating a result of lithographic processing that is executed by applying a second processing condition for controlling the lithographic apparatus at least partially different from the first processing condition,
a second acquisition unit configured to acquire a first allowable range based on the first collected data and acquire a second allowable range at least partially different form the first allowable range based on the second collected data, and,
a judgement unit configured to judge that an abnormality has occurred in collected data indicating a result of lithographic processing that is executed by applying the first processing condition in a case where the collected data indicating is not within the first allowable range, and judge that an abnormality has occurred in collected data indicating a result of the lithographic processing that is executed by applying the second processing condition in a case where the collected data is not within the second allowable range;
wherein the information processing apparatus judges that an abnormality has occurred in the collected data collected in a state where lithographic processing is executed by the lithography apparatus.

22. The lithography system according to claim 21, wherein the first processing condition is determined before the lithographic processing by applying the first processing condition is executed and the second processing condition is determined before the lithographic processing by applying the second processing condition is executed.

23. A manufacturing method for manufacturing an article from a processed substrate, comprising:
forming a pattern on a substrate by using a lithography system; and
processing the substrate on which the pattern is formed, wherein the lithography system includes
a lithography apparatus configured to form a pattern on a substrate, and
an information processing apparatus including
a first acquisition unit configured to acquire first collected data indicating a result of lithographic processing that is executed by applying a first processing condition for controlling the lithography apparatus to execute lithographic processing for forming a pattern and second collected data indicating a result of lithographic processing that is executed by applying a second processing condition for controlling the lithographic apparatus at least partially different form the first processing condition,
a second acquisition unit configured to acquire a first allowable range based on the first collected data and acquire a second allowable range at least partially different form the first allowable range based on the second collected data, and
a judgement unit configured to judge that an abnormality has occurred in collected data indicating a result of lithographic processing that is executed by applying the first processing condition in a case where the collected data is not within the first allowable range, and judge that an abnormality has occurred in collected data indicating a result of lithographic processing that is executed by applying the second processing condition in a case where the collected data is not within the second allowable range.

24. The manufacturing method according to claim 23, wherein the first processing condition is determined before the lithographic processing by applying the first processing condition is executed and the second processing condition is determined before the lithographic processing by applying the second processing condition is executed.

* * * * *